(12) United States Patent
Kanemoto

(10) Patent No.: US 8,338,896 B2
(45) Date of Patent: Dec. 25, 2012

(54) MEMS SENSOR, MEMS SENSOR MANUFACTURING METHOD, AND ELECTRONIC DEVICE

(75) Inventor: Kei Kanemoto, Suwa (JP)

(73) Assignee: Seiko Epson Corporation (JP)

( * ) Notice: Subject to any disclaimer, the term of this patent is extended or adjusted under 35 U.S.C. 154(b) by 324 days.

(21) Appl. No.: 12/731,572

(22) Filed: Mar. 25, 2010

(65) Prior Publication Data

US 2010/0244160 A1 Sep. 30, 2010

(30) Foreign Application Priority Data

Mar. 26, 2009 (JP) ................................. 2009-077454
Mar. 16, 2010 (JP) ................................. 2010-058818

(51) Int. Cl.
*H01L 29/84* (2006.01)

(52) U.S. Cl. ................................. 257/415; 257/E29.324

(58) Field of Classification Search ........................ None
See application file for complete search history.

(56) References Cited

U.S. PATENT DOCUMENTS

| | | | |
|---|---|---|---|
| 5,563,343 | A | 10/1996 | Shaw et al. |
| 5,610,335 | A | 3/1997 | Shaw et al. |
| 6,149,190 | A | 11/2000 | Galvin et al. |
| 6,170,332 | B1 | 1/2001 | MacDonald et al. |
| 6,199,874 | B1 | 3/2001 | Galvin et al. |
| 6,538,296 | B1 * | 3/2003 | Wan .............................. 257/415 |
| 6,909,158 | B2 * | 6/2005 | Yoshioka et al. ............. 257/414 |
| 7,004,026 | B2 * | 2/2006 | Kano et al. .................. 73/514.32 |
| 7,402,449 | B2 | 7/2008 | Fukuda et al. |
| 7,418,864 | B2 * | 9/2008 | Asami et al. ................ 73/514.32 |
| 2004/0094814 | A1 * | 5/2004 | Yoshioka et al. ............. 257/414 |
| 2009/0049911 | A1 | 2/2009 | Fukuda et al. |
| 2009/0064785 | A1 | 3/2009 | Fukuda et al. |

FOREIGN PATENT DOCUMENTS

| | | |
|---|---|---|
| JP | 2005-140792 | 6/2005 |
| JP | 2006-263902 | 10/2006 |

OTHER PUBLICATIONS

Evoy, Stephane. "Case Study: Capacitive Accelerometer." ECE 658. University of Alberta, Alberbta. 2006.*
Amini, Babak Vakili, and Farrokh Ayazi. "Micro-gravity Capacitive Silicon-on-insulator Accelerometers." Journal of Micromechanics and Microengineering 15.11 (2005): 2113-120.*

(Continued)

*Primary Examiner* — Victor A Mandala
*Assistant Examiner* — Joseph Schoenholtz
(74) *Attorney, Agent, or Firm* — Harness, Dickey & Pierce, P.L.C.

(57) ABSTRACT

A MEMS sensor formed by processing a multi-layer wiring structure, includes: a movable weight portion coupled to a fixed frame portion with an elastic deformable portion and having a hollow portion formed at the periphery; a capacitance electrode portion including a fixed electrode portion fixed to the fixed frame portion and a movable electrode portion connected to the movable weight portion and arranged to face the fixed electrode portion; and an adjusting layer for adjusting at least one of a mass of the movable weight portion, a damping coefficient of the movable electrode portion, and spring characteristics in the elastic deformable portion, wherein the adjusting layer includes at least one insulating layer that is a constituent element of the multi-layer wiring structure.

9 Claims, 17 Drawing Sheets

OTHER PUBLICATIONS

Mistry, Kalyan Kumar, K. B. M. Swamy, and Siddhartha Sen. "Design of an SOI-MEMS High Resolution Capacitive Type Single Axis Accelerometer." Microsystem Technologies 16.12 (2010): 2057-066.*

Aaltonen, Lasse. Integrated Interface Electronics for Capacitive MEMS Inertial Sensors. Thesis. Aalto University—School of Science and Technology, 2010. Espoo: Aalto University School of Science and Technology, 2010.*

Sethuramalingam, T.K.; Vimalajuliet, A.;, "Design of MEMS based capacitive accelerometer," Mechanical and Electrical Technology (ICMET), 2010 2nd International Conference on , vol., No., pp. 565-568, Sep. 10-12, 2010.*

* cited by examiner

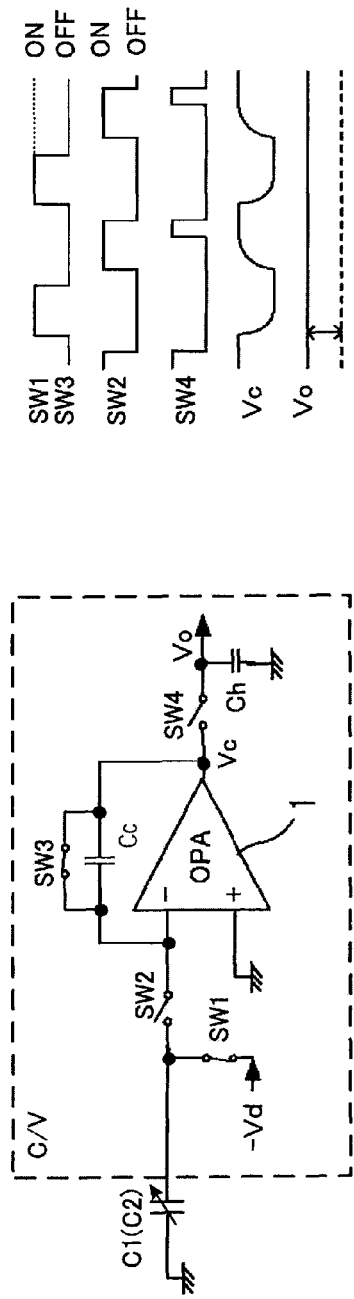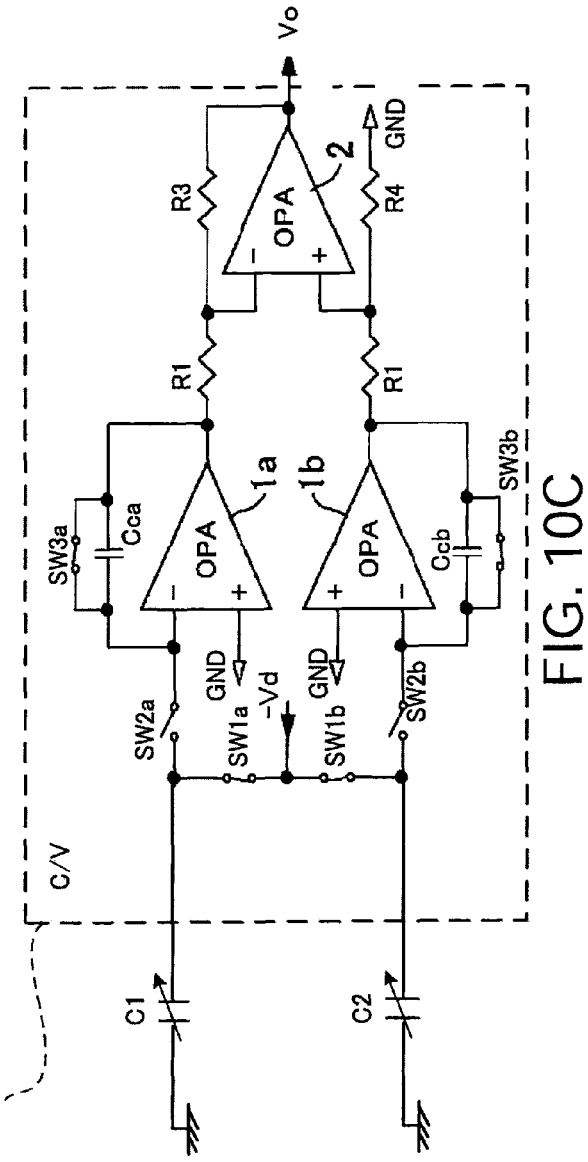
FIG. 10A
FIG. 10B
FIG. 10C

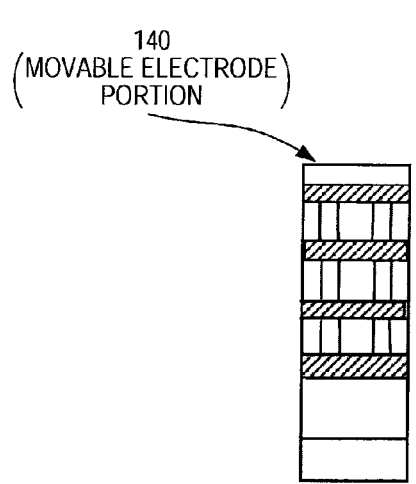 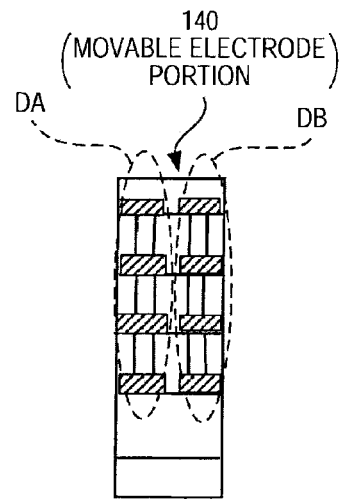
FIG.17A  FIG.17B
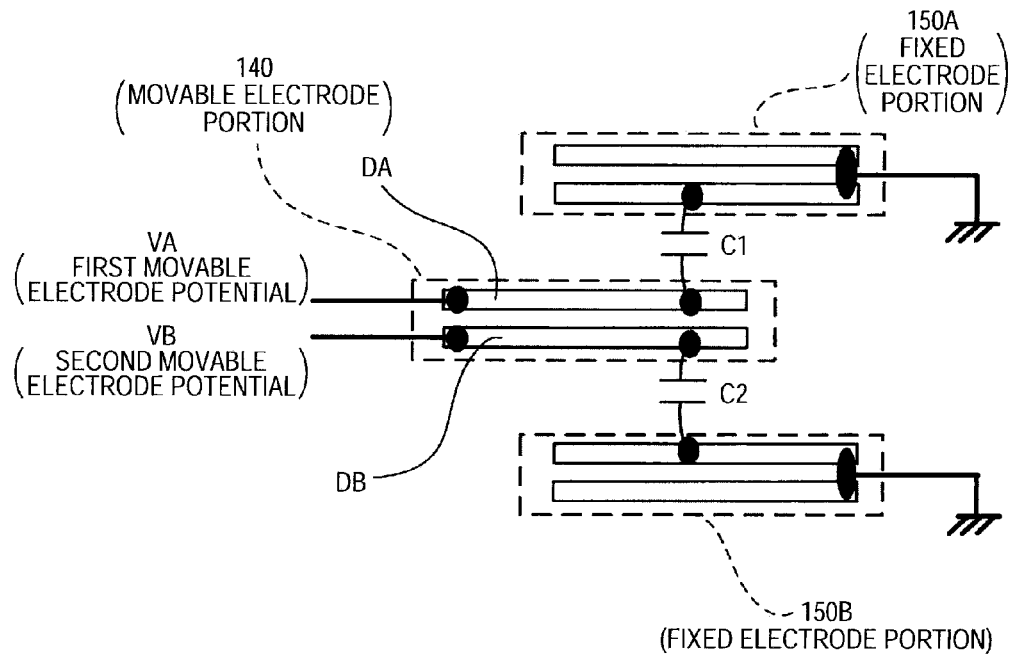
FIG.17C

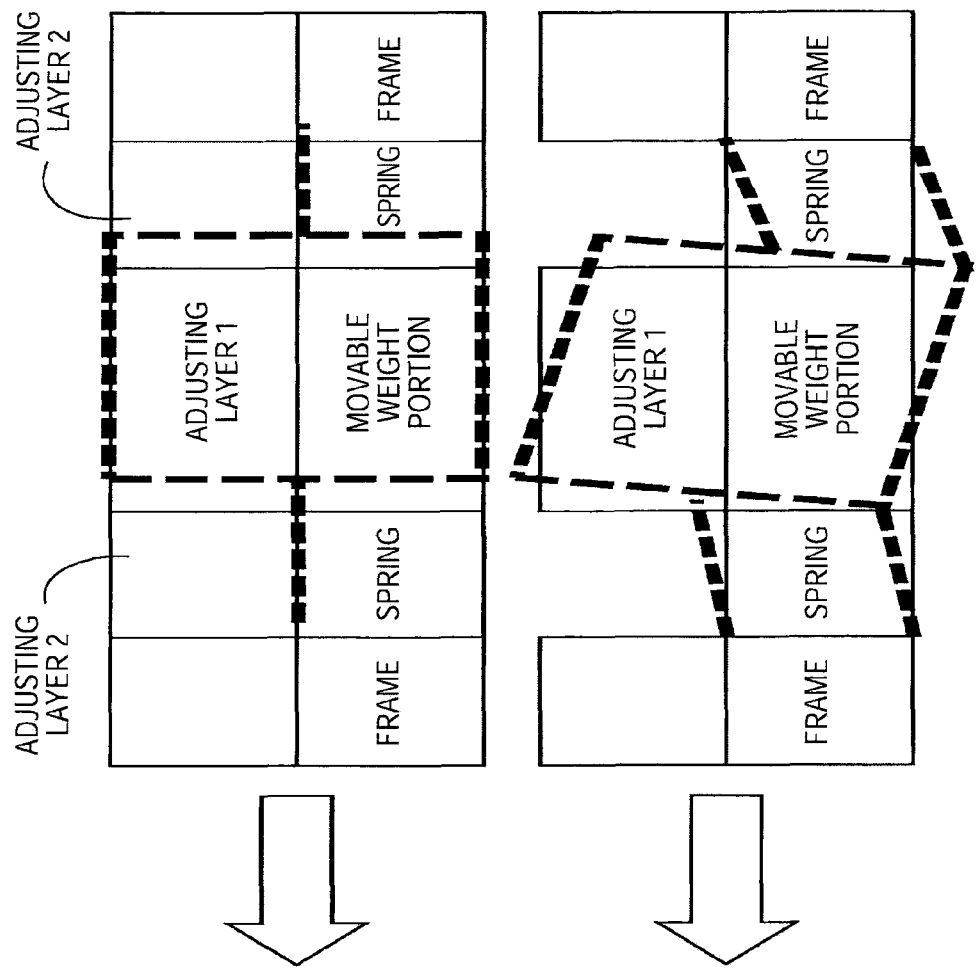

MEMS SENSOR, MEMS SENSOR MANUFACTURING METHOD, AND ELECTRONIC DEVICE

BACKGROUND

1. Technical Field

The present invention relates to a MEMS sensor (Micro Electro Mechanical Sensor), a MEMS sensor manufacturing method, and an electronic device.

2. Related Art

As a silicon MEMS acceleration sensor with a CMOS integrated circuit, for example, a reduction in size and cost of the MEMS sensor is rapidly progressing. The application and market of the MEMS sensor are expanding. In a main device form, an IC chip that converts a physical quantity into an electric signal and outputs the same is made into one package by a mounting process after a wafer process inmost cases. For achieving an extreme reduction in size and cost, a technique of integrally forming a sensor chip and an IC chip by a wafer process is required (refer to JP-A-2006-263902).

In a capacitive MEMS sensor (capacitive MEMS physical quantity sensor) that detects a physical quantity such as acceleration or pressure based on change in capacitance value of a capacitor configured by a movable electrode portion and a fixed electrode portion, the movable electrode portion is formed integrally with a movable weight portion. The movable electrode portion is displaced along with the displacement of the movable weight portion to change the gap or facing area between the movable electrode portion and the fixed electrode portion, which causes the movement of charge. The movement of charge is converted into an electric signal (voltage signal) by, for example, a C/V conversion circuit including a charge amplifier, so that the physical quantity is detected. Moreover, in a typical MEMS sensor in which a movable electrode portion is integrated into a movable weight portion, the height of the movable electrode portion is the same as that of the movable weight portion (refer to FIGS. 4 and 5 in JP-A-2005-140792).

SUMMARY

For improving the detection sensitivity of the capacitive MEMS acceleration sensor, it is effective to increase a mass M of the movable weight portion. When the capacitive MEMS acceleration sensor is formed by using a process technique of a semiconductor device, a structure including the movable weight portion, the movable electrode portion, and the fixed electrode portion is formed of a stacked structure configured by stacking a plurality of films (insulating films, conductive material films, etc.). Therefore, when the mass M of the movable weight portion is intended to be increased, a height h of the stacked structure is inevitably increased. Accordingly, the height h of the movable electrode portion is also increased similarly.

On the other hand, the increase in the height h of the movable electrode portion increases the area of the movable electrode portion, whereby a damping coefficient D of squeeze film damping (hereinafter simply referred to as damping) as a main factor of damping is increased. When the movable electrode portion vibrates, gas in a space interposed between the movable electrode portion and the fixed electrode portion moves vertically, for example. At that time, the viscosity of the gas causes an action to stop the movement of the movable electrode. The damping means this action. Specifically, the damping coefficient D increases with the cube of the height h of the movable electrode portion.

The damping coefficient D relates to a (spring-mass system) Q value that is mechanical characteristics inherent to a structure and relates to the Brownian noise that causes a reduction in S/N of the MEMS sensor. That is, force acts on a movable structure due to the Brownian motion of the gas between the electrode portions, which serves as the Brownian noise equivalent acceleration, for example.

As described above, the damping coefficient D increases with the cube of the height h of the movable electrode portion. Therefore, when the height h of the stacked structure is increased for increasing the mass M of the movable weight portion, the height h of the movable electrode portion also increases at the same time. As a result, for example, there arise problems that desired resonant characteristics cannot be obtained due to an extreme reduction in the Q value, and that a reduction in S/N is caused due to an increase in the Brownian noise.

That is, in the MEMS sensor, the positive effect obtained by, for example, increasing the height h of the stacked structure to increase the mass M of the movable weight portion and the negative effect that the damping coefficient D in the movable electrode portion increases to reduce the Q value and increase the Brownian noise occur at the same time. That is, the degree of design freedom of the MEMS sensor is small. When the planar size, resonant frequency, and Q value of the movable structure (including the movable weight portion and the movable electrode portion) are fixed to respective desired design values, there are no countermeasures actually for designing the structure other than compromising adjustment for some adjustable dimension parameters (specifically, for example, the height of the movable electrode portion, the lateral width of the movable electrode portion, the distance (gap) between the movable electrode portion and the fixed electrode portion, etc.).

In the MEMS sensor, it is also necessary to adjust spring characteristics of the elastic deformable portion (spring portion) in an appropriate range. Spring characteristics need to be designed by considering electronic spring characteristics due to the Coulomb force of the capacitor in addition to mechanical spring characteristics.

According to some aspects of the invention, for example, the mass of a structure (for example, movable weight) and the height of an electrode that influence the detection sensitivity of a MEMS sensor can be set individually and more freely compared to the related art, and the degree of design freedom of the MEMS sensor can be improved. Moreover, the adjustment of spring characteristics, for example, can be carried out properly, so that the degree of design freedom of the MEMS sensor can be further improved.

(1) A first aspect of the invention is directed to a MEMS sensor formed by processing a multi-layer wiring structure, including: a movable weight portion coupled to a fixed frame portion with an elastic deformable portion and having a hollow portion formed at the periphery; a capacitance electrode portion including a fixed electrode portion fixed to the fixed frame portion and a movable electrode portion connected to the movable weight portion and arranged to face the fixed electrode portion; and an adjusting layer for adjusting at least one of a mass of the movable weight portion, a damping coefficient of the movable electrode portion, and spring characteristics in the elastic deformable portion, wherein the adjusting layer includes at least one insulating layer that is a constituent element of the multi-layer wiring structure. In another embodiment, A MEMS sensor comprising: a support portion; a movable weight portion; a connection portion connecting the support portion and the movable weight portion, is possible an elastic deformation; a fixed electrode portion extending from the support portion; and a movable electrode portion extending from the movable weight portion and disposed opposed to the fixed electrode portion, wherein at least one of the movable weight portion, the connection portion, the fixed electrode portion, and the movable electrode portion, includes an adjusting layer. The adjusting layer is an insulated layer. The adjusting layer is formed top or bottom at least one of the movable weight portion, the connection portion, the fixed electrode portion, and the movable electrode portion.

The adjusting layer is intentionally disposed for adjusting at least one of the mass of the movable weight portion, the damping coefficient of the movable electrode portion, and the spring characteristics in the elastic deformable portion. Since the adjusting layer is configured mainly by an insulating layer, the adjusting layer bears no relationship to electrical characteristics of the movable electrode portion and the fixed electrode portion that are formed in the capacitance electrode portion. Accordingly, this means the addition of another design parameter that is independent of the electrical characteristics (that is, facing area of the capacitor determined by the height and width of the capacitance electrode portion formed of a conductor) of the movable electrode portion and the fixed electrode portion. Therefore, an effect of improving the degree of design freedom of a MEMS sensor module or the like can be provided.

That is, in the related art, when the height of the capacitance electrode portion (that is, height of the conductor portion) is determined, the height of the movable weight portion is automatically determined. Therefore, the design is made on the assumption that they are the same each other. However, by introducing a concept of adjusting layer (new design parameter), the height of the movable weight portion can be adjusted separately from the height of the capacitance electrode (conductor) to efficiently increase amass (weight), the damping coefficient of the movable electrode portion can be adjusted, and the adjustment of characteristics of the elastic deformable portion (for example, adjustment of a mechanical spring constant, suppression of displacement of spring in an unnecessary direction, etc.) can be realized.

As described above, for example, an entire capacitance C0 of a capacitor relates to efficiency when acceleration applied is converted into change in capacitance (acceleration/conversion coefficient of a capacitance). Accordingly, such a design can be made that an optimum height of the electrode (metal portion) is determined by considering the entire capacitance of the capacitor, while that the thickness of the adjusting layer is adjusted to increase the entire height of the movable weight portion for effectively increasing the mass (weight) of the movable weight portion.

When the adjusting layer is formed by a semiconductor manufacturing process, the adjusting layer is formed also on the capacitance electrode (conductor) in principle. Therefore, the entire height of the capacitance electrode portion including the adjusting layer on the conductor changes. Since the entire height of the movable electrode portion is increased by the amount of the adjusting layer, the damping coefficient is also increased. Accordingly, by adjusting the height of the adjusting layer, the damping coefficient of the movable electrode portion can be adjusted. For example, when the damping coefficient is too small, vibration generated in the movable electrode portion continues for a long time. For example, when vibration near a resonant frequency is generated due to the falling or the like of the MEMS sensor, the movable electrode portion is likely to be damaged in some cases. On the other hand, when the damping coefficient of the movable electrode portion is too large, there arise problems that a desired value cannot be realized due to an extreme reduction in Q value of a resonant vibrator, and that a reduction in S/N is caused due to an increase in the Brownian noise with respect to the sensitivity of the MEMS sensor. Accordingly, it is necessary to set the damping coefficient of the movable electrode portion in an appropriate range. In this manner, the adjusting layer has also a function of adjusting the damping coefficient of the movable electrode portion in an appropriate range.

When the height of the adjusting layer is not so large (when it is in an allowable range), the Q value is not extremely reduced, and the Brownian noise in the capacitance electrode portion (electrode portion) is not rapidly increased. On the other hand, since the movable weight portion has a large area, the weight of the movable weight portion is effectively increased by the addition amount of the adjusting layer. The effect of increasing the mass of the movable weight portion becomes dominant, so that the sensitivity of the MEMS sensor (acceleration sensor, etc.) is improved.

When the adjusting layer is formed by a semiconductor manufacturing process, the adjusting layer is disposed also in the elastic deformable portion in principle. In this case, a mechanical spring constant in the elastic deformable portion (spring portion) is increased, while an electronic spring constant (spring constant due to the Coulomb force) becomes relatively small to be negligible. Therefore, an effect of facilitating the design of the elastic deformable portion (spring portion) can also be provided.

That is, the elastic deformable portion and the movable weight portion supported by the elastic deformable portion function also as a vibrating portion having predetermined resonant characteristics. For assuring desired resonant characteristics in the vibrating portion, the value of spring constant in the elastic deformable portion (spring portion) needs to be confined in an appropriate range. However, an effective spring constant is not determined only by the mechanical spring constant of the elastic deformable portion (spring portion) but comprehensively determined also by considering an electronic spring constant due to static electricity force (the Coulomb force) acting between the fixed electrode portion and the movable electrode portion in the capacitance electrode portion. That is, an effective spring constant is determined by (mechanical spring constant-electronic spring constant).

Accordingly, the equation of linear spring characteristics expressed by $F=kX$ (F is force, k is a spring constant, and X is a displacement amount) is not established unless the electronic spring constant is designed so as to be sufficiently smaller than the mechanical spring constant, which is a design restriction. Meanwhile, a material usable for the elastic deformable portion is limited. Moreover, the shape or thickness of the elastic deformable portion needs to be comprehensively determined by considering flexible deformation in a direction in which acceleration may apply, the prevention of unnecessary vibration, intensity against vibration, or the like. Therefore, the shape or thickness cannot be determined only by considering the mechanical spring constant.

In this case, when the adjusting layer is formed on the elastic deformable portion (for example, formed of a conductor and at least one insulating layer), the mechanical spring constant in an elastic member is increased due to the rigidity of the adjusting layer (for example, including an inorganic insulating film), and the electronic spring constant (spring constant due to the Coulomb force) becomes relatively small so as to be negligible. Therefore, the design of the elastic deformable portion (spring portion) is facilitated. Because of the presence of the adjusting layer, the movement of the elastic deformable portion in a vertical direction (direction perpendicular to the substrate) is suppressed when force due to acceleration applies. This provides an effect of reducing the possibility of causing unnecessary deformation such as distortion. Further, the warping deformation of the movable electrode portion (and the fixed electrode portion) due to a thermal expansion coefficient is suppressed. Accordingly, the possibility of causing such a disadvantage that the facing area of the capacitor is slightly changed due to temperature change is also reduced.

As described above, the adjusting layer provides an effect of effectively increasing the mass (weight) of the movable weight portion separately from the electrical characteristics of the capacitance electrode portion (conductor). Moreover, for example, the adjusting layer provides an effect of adjusting the damping coefficient in the capacitance electrode portion so as not to extremely decrease the Q value or rapidly increase the Brownian noise due to air resistance (Brownian motion of gas) and effectively increasing the weight of the movable weight portion to contribute to the improvement of the sensitivity of the MEMS sensor. Further, the adjusting layer has an effect of increasing a mechanical spring constant to relatively reduce the influence of an electronic spring constant. In addition, the adjusting layer has an effect of suppressing deformation in the elastic deformable portion in an unnecessary direction to effectively prevent distortion or the like. The adjusting layer further has an effect of suppressing the warping deformation of the movable electrode portion (and the fixed electrode portion) due to a thermal expansion coefficient.

Accordingly, even when the lateral width of an electrode has to be extremely elongated disadvantageously in the related art, a MEMS sensor having a desired size and a desired sensitivity can be designed by adjusting the thickness (and layer configuration) of the adjusting layer in an actual range. Accordingly, the degree of design freedom is improved. Therefore, a MEMS sensor that is small, has high performance, and can be manufactured by using an IC process can be efficiently designed.

(2) A second aspect of the invention is directed to the MEMS sensor according to the first aspect of the invention, wherein the adjusting layer includes at least one insulating layer and an isolated conductor electrically independent of the movable electrode portion and the fixed electrode portion, the insulating layer and the conductor being constituent elements of the multi-layer wiring structure.

By using an isolated conductor (generally formed of a conductive material greater in specific gravity than an insulating layer) as a constituent element of the adjusting layer in addition to an insulating layer, the weight of the adjusting layer can be effectively increased. Accordingly, for example, the adjustment effect of the mass of the movable weight portion can be enhanced. Alternatively, an effect of enhancing a deformation preventing effect in the elastic deformable portion in an unnecessary direction can be provided.

(3) A third aspect of the invention is directed to the MEMS sensor according to the first aspect of the invention, wherein each of the movable electrode portion and the fixed electrode portion has a wall portion formed of a plurality of conductors that are in different layers and a plug that connects between the plurality of conductors and is formed of a conductive material, the conductors and the plug being constituent elements of the multi-layer wiring structure, and the adjusting layer is configured by at least one of a stacked structure positioned on the wall portion and a stacked structure positioned below the wall portion. In another embodiment, the movable weight portion is a laminated layer structure including a plurality of conductive layers, a between-layers insulation layers which is disposed between the adjoining conductive layers of the plurality of conductive layers. The insulated layer is embedded a plug, and the plug has specific gravity larger than that of the insulated layer.

When a groove pattern extending in a predetermined direction is formed in each insulating layer, and a plug material such as tungsten is embedded in the groove pattern to form a wall portion, a capacitor having a desired facing area can be configured by using a semiconductor process without laboring. When the wall portion is formed also in the movable weight portion, the mass of the movable weight portion can be effectively increased.

The adjusting layer can be formed on the stacked structure having the wall portion or can be formed below the stacked structure. Moreover, the adjusting layer can be formed both on and below the stacked structure. Determination can be properly made as to which of the modes is adopted by considering such design viewpoints that, for example, electrodes and wiring necessary for a MEMS sensor are assured, and that the leading of wiring is efficiently performed.

(4) A fourth aspect of the invention is directed to the MEMS sensor according to the first aspect of the invention, wherein the adjusting layer has a first adjusting layer for adjusting the mass of the movable weight portion, a second adjusting layer for adjusting the damping coefficient of the movable electrode portion, and a third adjusting layer for adjusting the spring characteristics in the elastic deformable portion. In another embodiment, the adjusting layer including a first adjusting layer formed the movable weight portion, a second adjusting layer formed the fixed electrode portion and the movable electrode portion, a third adjusting layer formed the connection portion.

The adjusting layer in the fourth aspect of the invention includes the first adjusting layer for adjusting the mass of the movable weight portion, the second adjusting layer for adjusting the damping coefficient of the movable electrode portion, and the third adjusting layer for adjusting the spring characteristics in the elastic deformable portion. Accordingly, with the adjusting layer, the adjustment of the mass of the movable weight portion, the adjustment of the damping coefficient of the movable electrode portion, and the adjustment of the spring characteristics (for example, spring constant, displacement characteristics in a necessary direction, displacement suppressing characteristics in an unnecessary direction, etc.) of the elastic deformable portion (spring portion) can be performed.

(5) A fifth aspect of the invention is directed to the MEMS sensor according to the first aspect of the invention, wherein the adjusting layer only includes a first adjusting layer for adjusting the mass of the movable weight portion and a third adjusting layer for adjusting the spring characteristics in the elastic deformable portion.

In the fifth aspect of the invention, only the first adjusting layer for adjusting the mass of the movable weight portion and the third adjusting layer for adjusting the spring characteristics of the elastic deformable portion are disposed, but the second adjusting layer for adjusting the damping coefficient of the movable electrode portion is not disposed. In this case, the damping coefficient of the movable electrode portion is determined only by the height of the stacked structure including the wall portion. When there is no need to adjust the damping coefficient of the movable electrode portion with the adjusting layer, the structure of the fifth aspect of the invention may be adopted. The structure of the adjusting layer of the fifth aspect of the invention can be formed by, for example, forming a stacked structure as an adjusting layer and thereafter selectively removing the stacked structure in the capacitance electrode portion (including the movable electrode portion) by anisotropic etching or the like.

(6) A sixth aspect of the invention is directed to the MEMS sensor according to the first aspect of the invention, wherein the adjusting layer only includes a first adjusting layer for adjusting the mass of the movable weight portion.

In the sixth aspect of the invention, only the first adjusting layer for adjusting the mass of the movable weight portion is disposed, but the second adjusting layer and the third adjusting layer are not disposed. When there is no particular need to adjust the damping coefficient of the movable electrode portion and adjust the characteristics of the elastic deformable portion with the adjusting layer, the structure of the sixth aspect of the invention may be adopted. The structure of the adjusting layer of the sixth aspect of the invention can be formed by, for example, forming a stacked structure as an adjusting layer and thereafter selectively removing the stacked structure in the capacitance electrode portion (including the movable electrode portion) and the stacked structure in the elastic deformable portion by anisotropic etching or the like.

(7) A seventh aspect of the invention is directed to the MEMS sensor according to the fourth aspect of the invention, wherein the first to third adjusting layers have the same height.

In the seventh aspect of the invention, the first to third adjusting layers have the same thickness. For example, the structure of the adjusting layer of the seventh aspect of the invention can be formed by uniformly forming a stacked structure as an adjusting layer on the portions by a semiconductor manufacturing process. When the seventh aspect of the invention is adopted, an effect that the adjusting layer is easily formed is provided.

(8) An eighth aspect of the invention is directed to the MEMS sensor according to the fourth aspect of the invention, wherein any one of the first to third adjusting layers has a different height from that of at least one of the other two adjusting layers. In another embodiment, the thickness of the first adjusting layer is different from the thickness of at least one of the second adjusting layer and the third adjusting layer.

In the eighth aspect of the invention, for example, the second adjusting layer has the same height as that of the third adjusting layer, and the first adjusting layer has a different height from that of the second adjusting layer and the third adjusting layer, in some cases. The first adjusting layer has the same height as that of the second adjusting layer, and the first adjusting layer and the second adjusting layer have a different height from that of the third adjusting layer, in some cases. Moreover, the first adjusting layer has the same height as that of the third adjusting layer, and the second adjusting layer has a different height from that of the first adjusting layer and the third adjusting layer, in some cases. Moreover, the respective first to third adjusting layers have different heights in some cases. According to the eighth aspect of the invention, the heights of the respective adjusting layers can be individually optimized. Accordingly, the degree of design freedom is further improved.

(9) A ninth aspect of the invention is directed to the MEMS sensor according to the fourth aspect of the invention, wherein any one of the first to third adjusting layers has a different layer configuration from that of at least one of the other two adjusting layers. In another embodiment, a layer-structure of the first adjusting layer is different from a layer-structure of at least one of the second adjusting layer and the third adjusting layer.

The heights of the respective adjusting layers are optimized in the eighth aspect of the invention, while the layer configurations of the respective adjusting layers are optimized in the ninth aspect of the invention to enhance the degree of design freedom.

That is, in the ninth aspect of the invention, for example, the second adjusting layer has the same layer configuration as that of the third adjusting layer, and the first adjusting layer has a different layer configuration from that of the second adjusting layer and the third adjusting layer, in some cases. Moreover, the first adjusting layer has the same layer configuration as that of the second adjusting layer, and the first adjusting layer and the second adjusting layer have a different layer configuration from that of the third adjusting layer. Moreover, the first adjusting layer has the same layer configuration as that of the third adjusting layer, and the second adjusting layer has a different layer configuration from that of the first adjusting layer and the third adjusting layer, in some cases. The respective first to third adjusting layers have different layer configurations in some cases.

(10) A tenth aspect of the invention is directed to the MEMS sensor according to the first aspect of the invention, wherein the movable weight portion has a wall portion isolated from the movable electrode portion and the fixed electrode portion and formed of a plurality of conductors that are in different layers and a plug that connects between the plurality of conductors and is formed of a conductive material, the conductors and the plug being constituent elements of the multi-layer wiring structure.

In the tenth aspect of the invention, an electrically isolated wall portion is disposed in the movable weight portion, so that the mass of the movable weight portion can be efficiently increased. That is, a typical plug for establishing electrical continuity is embedded in, for example, a circular through hole. In the tenth aspect of the invention, however, a plug material is embedded in, for example, a through hole pattern extending in a predetermined direction, whereby a wall-shaped plug is formed. The plug material (conductive material, which is generally metal such as tungsten) is greater in specific gravity than the material of an insulating layer. By forming the wall-shaped plug structure, the entire amount of the plug material can be increased. Accordingly, the mass of the movable weight portion can be easily increased.

(11) An eleventh aspect of the invention is directed to the MEMS sensor according to the third aspect of the invention, wherein at least one of the movable electrode portion and the fixed electrode portion has, as the wall portion, a first wall portion and a second wall portion that are electrically independent of each other.

With the use of the structure, two capacitors C1 and C2 that are electrically independent of each other can be configured without laboring while saving space. For example, when the first wall portion disposed on one side surface side of one movable electrode portion faces a first fixed electrode portion, and the second wall portion disposed on the other side surface side of the movable electrode portion faces a second fixed electrode portion, the two capacitors C1 and C2 can be compactly formed.

(12) A twelfth aspect of the invention is directed a method for manufacturing a MEMS sensor including a movable weight portion coupled to a fixed frame portion with an elastic deformable portion and having a hollow portion formed at the periphery, a capacitance electrode portion including a fixed electrode portion fixed to the fixed frame portion and a movable electrode portion connected to the movable weight portion and arranged to face the fixed electrode portion, and an adjusting layer for adjusting at least one of amass of the movable weight portion, a damping coefficient of the movable electrode portion, and spring characteristics in the elastic deformable portion, the adjusting layer including at least one insulating layer that is a constituent element of a multi-layer wiring structure, the method including: forming, on a substrate, the multi-layer wiring structure including a layer structure constituting the adjusting layer; patterning the multi-layer wiring structure by anisotropic etching to form a first hollow portion serving as an opening to expose the surface of the substrate; and isotropically etching the substrate by allowing an etchant for isotropic etching to reach the substrate via the opening to form a second hollow portion in communication with the first hollow portion. In another embodiment, A MEMS sensor manufacturing method for a MEMS sensor including a support portion; a movable weight portion; a connection portion connecting the support portion and the movable weight portion, is possible an elastic deformation; a fixed electrode portion extending from the support portion; and a movable electrode portion extending from the movable weight portion and disposed opposed to the fixed electrode portion, comprising: forming a laminated layer structure on a substrate; forming an adjusting layer at top layer or bottom layer of the laminated layer structure; forming a first cavity portion from a top layer of the laminated layer structure to surface of the substrate, by anisotropic etching; isotropically etching the substrate via the first cavity portion to form a second cavity portion between the substrate and the laminated layer structure.

According to the twelfth aspect of the invention, a MEMS sensor can be efficiently manufactured by using an IC manufacturing process technique. Moreover, an IC and a MEMS sensor can be formed concurrently by using a common manufacturing process technique. Accordingly, a sensor module or the like incorporating an IC therein can be easily formed.

(13) A thirteenth aspect of the invention is directed to the MEMS sensor according to the first aspect of the invention, an electronic device comprising the MEMS sensor.

According to this structure, it is able to improve detection sensitivity by the MEMS sensor.

BRIEF DESCRIPTION OF THE DRAWINGS

The invention will be described with reference to the accompanying drawings, wherein like numbers reference like elements.

FIGS. 10A to 10C explain a configuration and operation of the C/V conversion circuit.

FIGS. 17A to 17C show a structure example for giving independent potentials to respective two wall-shaped electrode portions in a movable electrode portion.

FIGS. 18A and 18B explain an effect (displacement suppressing effect in an unnecessary direction) of an adjusting layer in an elastic deformable portion.

DESCRIPTION OF EXEMPLARY EMBODIMENTS

Hereinafter, preferred embodiments of the invention will be described in detail. The embodiments described below are not intended to unreasonably limit the content of the invention set forth in the claims. Also, not all of the configurations described in the embodiments are essential as solving means.

First Embodiment

Figure 1:
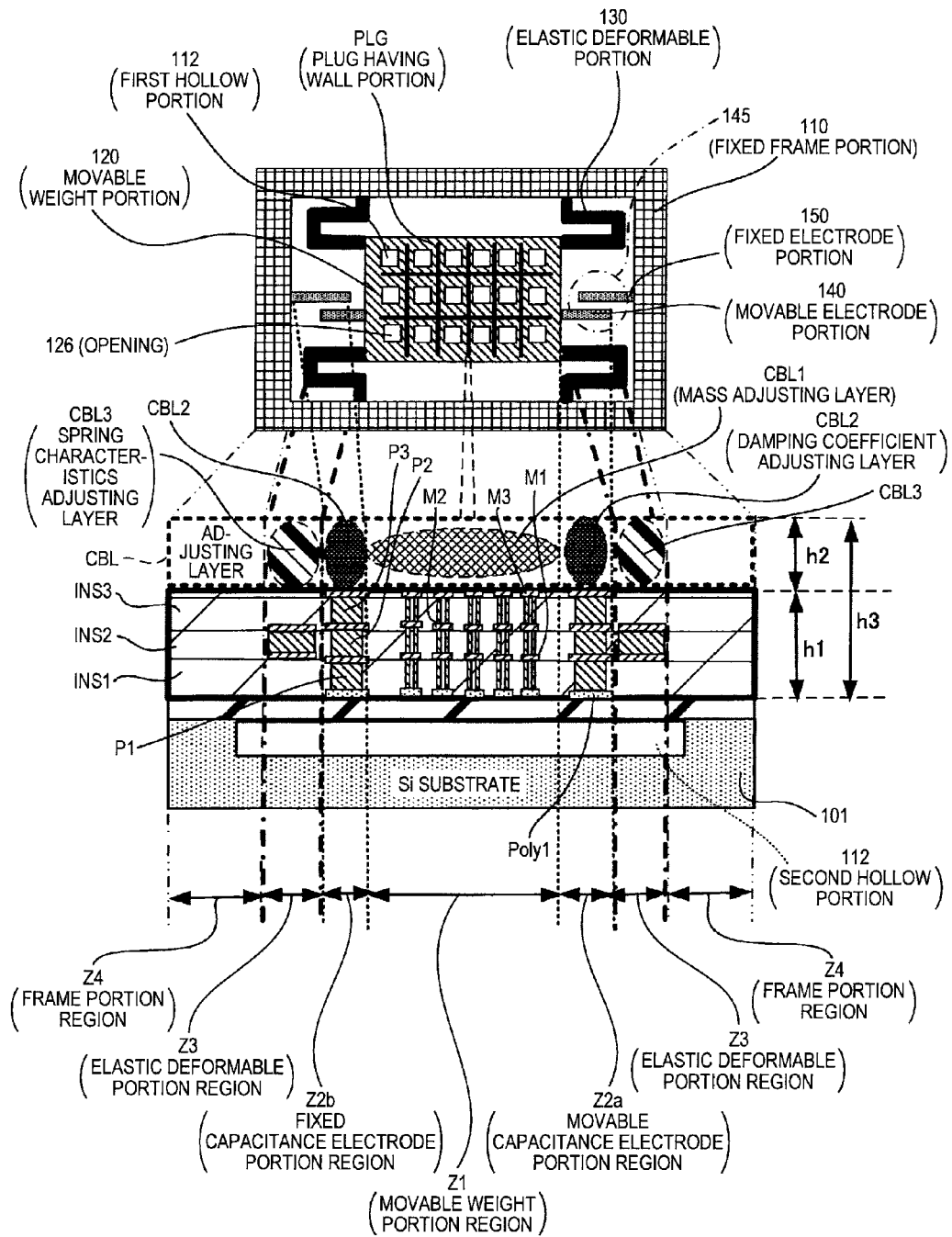
FIG. 1 shows an exemplary structure of an adjusting layer in a MEMS sensor of the invention.

In a first embodiment, an exemplary planar shape and cross-sectional structure of the MEMS sensor will be described. FIG. 1 shows an exemplary structure of a MEMS sensor (including adjusting layer) of the invention.

As shown in the upper side of FIG. 1, a capacitive MEMS acceleration sensor as the MEMS sensor has a movable weight portion 120 including a stacked structure (having a plurality of insulating layers and conductor members PLG having wall portions extending in a predetermined direction) formed by using a semiconductor manufacturing process, elastic deformable portions (connection portion) 130, a fixed frame portion (support portion) 110 formed of a silicon substrate, movable electrode portions 140, and fixed electrode portions 150. The movable electrode portion 140 and the fixed electrode portion 150 are arranged to face each other, so that the electrode portions form a capacitance electrode portion 145. The capacitance electrode portion 145 constitutes a capacitor (parallel-plate type capacitance). The movable electrode portions 140 are configured integrally with the movable weight portion 120. When the movable weight portion 120 vibrates in response to force due to acceleration, the movable electrode portions 140 vibrate similarly. This changes a gap d of the capacitor to change the capacitance value of the capacitor. Along with the change, the movement of charge occurs. A minute current caused by the charge movement is amplified by a charge amplifier, so that the value of the acceleration applied to the movable weight portion 120 can be detected.

In the lower side of FIG. 1, cross-sectional structures corresponding to the respective regions of the capacitive MEMS acceleration sensor shown in the upper side of FIG. 1 are shown. In the drawing, Z1 denotes a movable weight portion region, Z2a denotes a movable electrode portion region, Z2b denotes a fixed electrode portion region, Z3 denotes elastic deformable portion regions, and Z4 denotes fixed frame portion regions. In some cases, the regions Z2a and Z2b are collectively referred to as a capacitance electrode portion region (or simply referred to as an electrode portion region).

A second hollow portion 112 is formed in a silicon substrate 101. First hollow portions 126 are formed through the multi-layer stacked structure. The second hollow portion 112 is communicated with the first hollow portions 126. The stacked structure (in the drawing, indicated by an enclosing heavy line) including wall portions formed of conductors is formed on the silicon substrate 101. The stacked structure has a height h1.

The stacked structure includes a plurality of insulating layers (between-layers insulation layers) INS1 to INS3 that are in different layers, a first-layer metal M1, a second-layer metal M2, a third-layer metal M3, and a first-layer polysilicon Poly1. A wall portion (portion serving as an electrode of a capacitor) disposed in the movable electrode portion 140 and the fixed electrode portion 150 can be configured by the first-layer metal M1, the second-layer metal M2, the third-layer metal M3, the first-layer polysilicon Poly1, and plugs P1 to P3 in the respective layers.

An adjusting layer CBL (in the drawing, indicated by a heavy dotted line) is disposed on the stacked structure including the wall portions. The adjusting layer has a height h2. The adjusting layer CBL is intentionally disposed for adjusting at least one of a mass M of the movable weight portion 120, a damping coefficient D of the movable electrode portion 140, and spring characteristics in the elastic deformable portion 130.

The adjusting layer CBL functions differently depending on the location to be disposed and therefore can be classified into a plurality of adjusting layers. That is, the adjusting layer CBL includes a first adjusting layer CBL1 that is mainly aimed at adjusting the mass of the movable weight portion 120, a second adjusting layer CBL2 that is mainly aimed at adjusting the damping coefficient of the movable electrode portion 140, and a third adjusting layer CBL3 that is mainly aimed at adjusting spring characteristics in the elastic deformable portion 130.

Since the adjusting layer CBL is configured mainly by an insulating layer, the adjusting layer CBL bears no relationship to electrical characteristics of the movable electrode portion 140 and the fixed electrode portion 150 formed in the capacitance electrode portion. Accordingly, this means the addition of another design parameter that is independent of the electrical characteristics (that is, facing area of the capacitor determined by the height and width of the capacitance electrode portion formed of a conductor) of the movable electrode portion 140 and the fixed electrode portion 150. Therefore, an effect of improving the degree of design freedom of a MEMS sensor module or the like can be provided.

In FIG. 1 for example, the electrode portion (conductor) of the capacitor has the height h1, while the entire electrode portion including the adjusting layer, the movable weight portion 120, and the elastic deformable portion 130 each have a height h3. Therefore, the effective height h3 of each the portions can be independently adjusted separately from the height h1 of the electrode portion (conductor) of the capacitor.

In the related art, when the electrode portion (height of the conductor) is determined, the height of the movable weight portion 120 is automatically determined. Therefore, the design is made on the assumption that they are the same each other. However, by introducing a concept of adjusting layer (new design parameter), the height of the movable weight portion 120 can be adjusted separately from the height of the electrode portion (conductor) to efficiently increase the mass M, the damping coefficient D of the movable electrode portion 140 can be adjusted, and the adjustment of characteristics of the elastic deformable portion 130 (for example, adjustment of a mechanical spring constant K, suppression of displacement of spring in an unnecessary direction, etc.) can be realized.

As described above, for example, an entire capacitance C0 of a capacitor relates to efficiency when acceleration applied is converted into change in capacitance (acceleration/conversion coefficient of a capacitance). Accordingly, such a design can be made that an optimum height h1 of the electrode portion (conductor) is determined by considering the entire capacitance of the capacitor, while that the height h2 of the adjusting layer CBL is adjusted to optimize the effective height h3 of the movable weight portion 120 or the like for effectively increasing the mass M of the movable weight portion 120.

Moreover, the entire height h3 of the movable electrode portion 140 is increased by the amount of the height h2 of the second adjusting layer CBL2, and the damping coefficient D is also increased. Accordingly, by adjusting the height of the second adjusting layer CBL2, the damping coefficient D of the movable electrode portion 140 can also be adjusted.

For example, when the damping coefficient D is too small, vibration generated in the movable electrode portion 140 continues for a long time. For example, when vibration near a resonant frequency is generated due to the falling or the like of the MEMS sensor, the movable electrode portion 140 is likely to be damaged in some cases. On the other hand, when the damping coefficient D of the movable electrode portion 140 is too large, there arise problems that a desired value cannot be realized due to an extreme reduction in Q value of a resonant vibrator, and that a reduction in S/N is caused due to an increase in the Brownian noise with respect to the sensitivity of the MEMS sensor. Accordingly, it is necessary to set the damping coefficient of the movable electrode portion 140 in an appropriate range. In this manner, the second adjusting layer CBL2 has a function of adjusting the damping coefficient D of the movable electrode portion 140 in an appropriate range.

When the height of the second adjusting layer CBL2 is not so large (when it is in an allowable range), the resonant Q value in the movable weight portion is not extremely reduced, and the Brownian noise in the capacitance electrode portion (electrode portion) is not rapidly increased. On the other hand, since the movable weight portion 120 has a large area, the weight of the movable weight portion 120 is effectively increased by the addition amount of the adjusting layer. When the effect of increasing the mass of the movable weight portion becomes dominant, the sensitivity of the MEMS sensor (acceleration sensor) is improved.

When the adjusting layer CBL is formed by a semiconductor manufacturing process, the third adjusting layer CBL3 is disposed also in the elastic deformable portion 130 in principle. In this case, a mechanical spring constant in the elastic deformable portion (spring portion) is increased, while an electronic spring constant (spring constant due to the Coulomb force) becomes relatively small to be negligible. Therefore, an effect of facilitating the design of the elastic deformable portion (spring portion) 130 can also be provided.

That is, the elastic deformable portion 130 and the movable weight portion 120 supported by the elastic deformable portion 130 function also as a vibrating portion having predetermined resonant characteristics. For assuring desired resonant characteristics in the vibrating portion, the value of spring constant in the elastic deformable portion (spring portion)

130 needs to be confined in an appropriate range. However, an effective spring constant is not determined only by the mechanical spring constant of the elastic deformable portion (spring portion) 130 but comprehensively determined also by considering an electronic spring constant due to static electricity force (the Coulomb force) acting between the fixed electrode portion 150 and the movable electrode portion 140 in the capacitance electrode portion. That is, an effective spring constant is determined by (mechanical spring constant-electronic spring constant). An electronic spring constant has a non-linear value with respect to a distance (displacement amount).

Accordingly, the equation of linear spring characteristics expressed by $F=kX$ (F is force, k is a spring constant, and X is a displacement amount) is not established unless the electronic spring constant is designed so as to be sufficiently smaller than the mechanical spring constant, which is a design restriction. Meanwhile, a material usable for the elastic deformable portion 130 is limited. Moreover, the shape or thickness of the elastic deformable portion 130 needs to be comprehensively determined by considering flexible deformation in a direction in which acceleration may apply, the prevention of unnecessary vibration, intensity against vibration, or the like. Therefore, the shape or thickness cannot be determined only by considering the mechanical spring constant.

In this case, when the third adjusting layer CBL3 is formed on the elastic deformable portion (for example, formed of at least one conductor and at least one insulating layer) 130, the mechanical spring constant in the elastic deformable portion 130 is increased due to the rigidity of the third adjusting layer CBL3 (for example, including an inorganic insulating film), and the electronic spring constant (spring constant due to the Coulomb force) becomes relatively small so as to be negligible. Therefore, the design of the elastic deformable portion (spring portion) 130 is facilitated. Because of the presence of the third adjusting layer CBL3, the movement of the elastic deformable portion 130 in a vertical direction (direction perpendicular to the substrate) is suppressed when force due to acceleration applies. This provides an effect of reducing the possibility of causing unnecessary deformation such as distortion.

FIGS. 18A and 18B are now referred to. FIGS. 18A and 18B explain an effect (displacement suppressing effect in an unnecessary direction) of the third adjusting layer CBL3 in the elastic deformable portion 130. In the elastic deformable portion 130, by disposing the third adjusting layer CBL3, the movement of the elastic deformable portion (spring portion) 130 in the vertical direction (direction perpendicular to the substrate) is restricted, for example.

FIG. 18B shows exemplary elastic deformation when the third adjusting layer CBL3 is not disposed. In FIG. 18B, when force due to acceleration is applied in a direction of arrow, the movable weight portion 120 is deformed in some cases in the vertical direction (direction perpendicular to a horizontal plane). This sometimes causes unnecessary movement such as distortion. FIG. 18A shows exemplary elastic deformation when the third adjusting layer CBL3 is disposed. As is apparent from FIG. 18A, the movement of the elastic deformable portion 130 in an unnecessary direction (for example, vertical direction) is restricted. Accordingly, an effect of reducing the possibility of causing unnecessary movement such as distortion is provided. Unnecessary deformation in the elastic deformable portion (spring portion) 130 is suppressed, so that the detection sensitivity of the MEMS sensor is further improved.

The description will be continued by returning to FIG. 1. By disposing the third adjusting layer CBL3, the warping deformation of the movable electrode portion 140 (and the fixed electrode portion 150) due to a thermal expansion coefficient is also suppressed. Accordingly, the possibility of causing such a disadvantage that the facing area of the capacitor is slightly changed due to temperature change is also reduced.

As described above, the adjusting layer CBL provides an effect of effectively increasing the mass M of the movable weight portion 120 separately from electrical characteristics of the capacitance electrode portion (conductor). Moreover, for example, the adjusting layer CBL provides an effect of adjusting the damping coefficient D in the capacitance electrode portion so as to not to extremely decrease the Q value or rapidly increase the Brownian noise due to air resistance (Brownian motion of gas) and effectively increasing the weight of the movable weight portion 120 to contribute to the improvement of the sensitivity of the MEMS sensor. The adjusting layer CBL has an effect of increasing a mechanical spring constant to relatively reduce the influence of an electronic spring constant. In addition, the adjusting layer CBL has an effect of suppressing deformation in the elastic deformable portion 130 in an unnecessary direction to effectively prevent distortion or the like. The adjusting layer CBL further has an effect of suppressing the warping deformation of the movable electrode portion 140 (and the fixed electrode portion 150) due to a thermal expansion coefficient.

Accordingly, even when the lateral width of an electrode has to be extremely elongated disadvantageously in the related art, a MEMS sensor having a desired size and a desired sensitivity can be designed by adjusting the thickness (and layer configuration) of the adjusting layer CBL in an actual range. Accordingly, the degree of design freedom is improved. Therefore, a MEMS sensor (capacitive acceleration sensor, gyro sensor, etc.) that is small, has high performance, and can be manufactured by using an IC process can be efficiently designed.

Implementing Mode of Adjusting Layer CBL

Figure 2A:
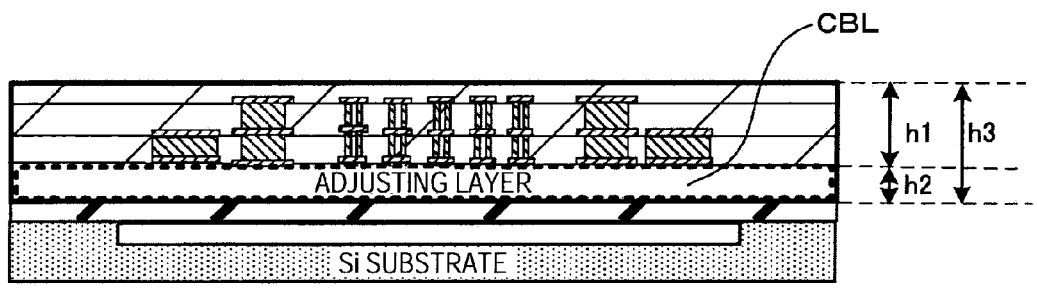
FIGS. 2A and 2B show other exemplary structures of the adjusting layer.
Figure 2B:
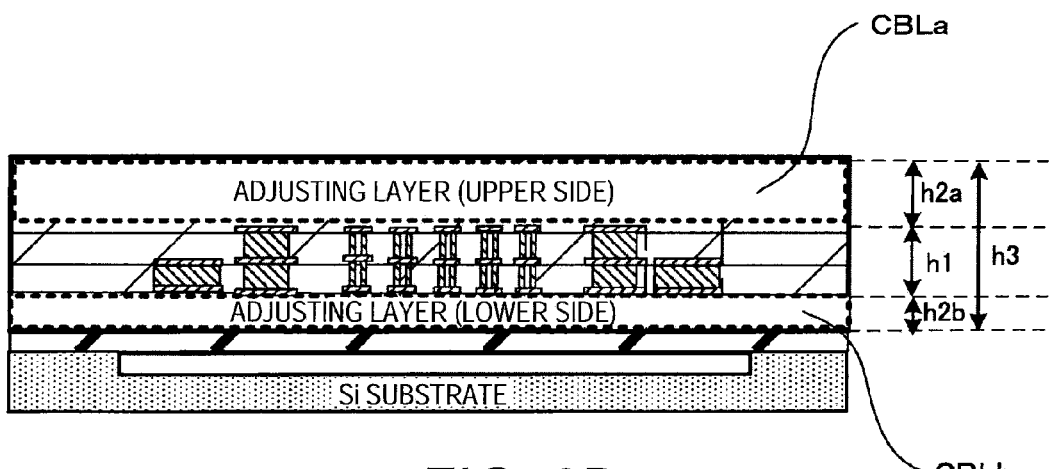

FIGS. 2A and 2B show other exemplary structures of the adjusting layer. As shown in FIG. 2A, the adjusting layer CBL can be formed below the stacked structure having the wall portions. As shown in FIG. 2B, adjusting layers CBLa and CBLb can be respectively disposed on and below the stacked structure having the wall portions. Determination can be properly made as to which of the modes is adopted by considering such design viewpoints that, for example, electrodes and wiring necessary for a MEMS sensor are assured, and that the leading of wiring is efficiently performed.

Figure 3:
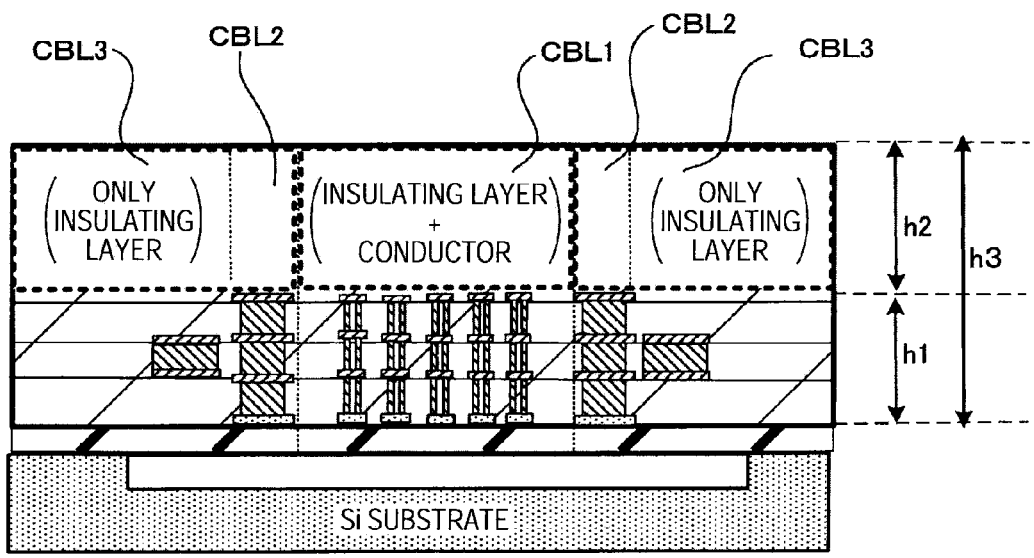
FIG. 3 shows still another exemplary structure of the adjusting layer.

FIG. 3 shows still another exemplary structure of the adjusting layer. In FIG. 3, only the first adjusting layer CBL1 is configured by an insulating layer and a conductor. The second adjusting layer CBL2 and the third adjusting layer CBL3 are configured only by an insulating layer. In the mode of the adjusting layer in FIG. 3, the layer configurations of the respective adjusting layers are optimized, so that the degree of design freedom can be enhanced.

In the mode shown in FIG. 3, for example, the second adjusting layer CBL2 has the same layer configuration as that of the third adjusting layer CBL3, and the first adjusting layer CBL1 has a different layer configuration from that of the second adjusting layer CBL2 and the third adjusting layer CBL3, in some cases. Moreover, the first adjusting layer CBL1 has the same layer configuration as that of the second adjusting layer CBL2, and the first adjusting layer CBL1 and the second adjusting layer CBL2 have a different layer configuration from that of the third adjusting layer CBL3, in some cases. Further, the first adjusting layer CBL1 has the same layer configuration as that of the third adjusting layer CBL3, and the second adjusting layer CBL2 has a different layer configuration from that of the first adjusting layer CBL1 and the third adjusting layer CBL3, in some cases. In addition, the respective first to third adjusting layers CBL1 to CBL3 have different layer configurations in some cases.

Figure 4A:
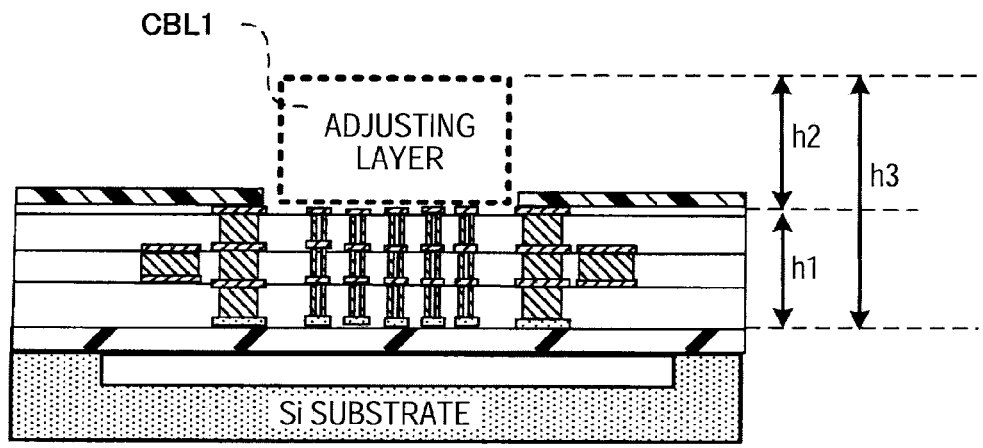
FIGS. 4A and 4B shows still other exemplary structures of the adjusting layer.
Figure 4B:
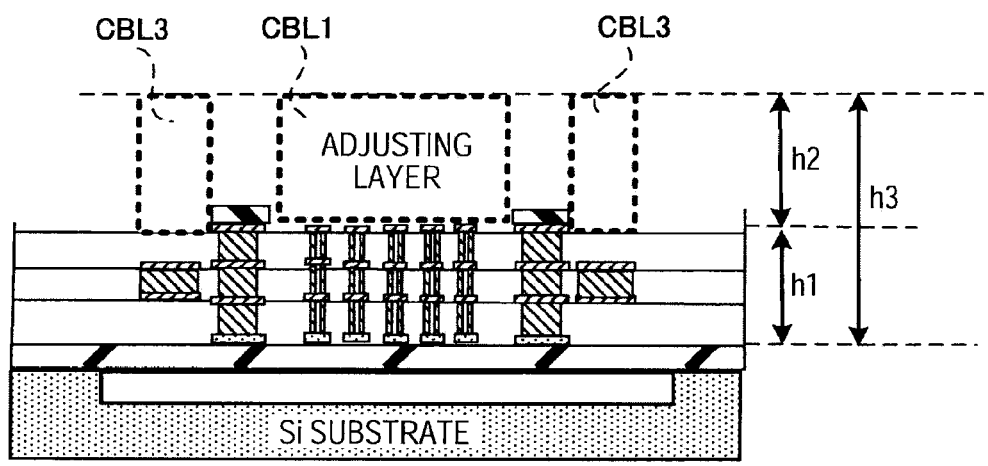

FIGS. 4A and 4B show still other exemplary structures of the adjusting layer. In FIG. 4A, only the first adjusting layer CBL1 that is mainly aimed at adjusting the mass of the movable weight portion 120 is disposed, but the second adjusting layer CBL2 and the third adjusting layer CBL3 are not disposed. When there is no particular need to adjust the damping coefficient D of the movable electrode portion and adjust the characteristics of the elastic deformable portion 130 with the second adjusting layer CBL2 and the third adjusting layer CBL3, the structure of FIG. 4A may be adopted.

The structure of the adjusting layer shown in FIG. 4A can be formed by, for example, forming a stacked structure as an adjusting layer and thereafter selectively removing the stacked structure in the capacitance electrode portion (including the movable electrode portion 140 and the fixed electrode portion 150) and the stacked structure in the elastic deformable portion 130 by anisotropic etching or the like.

In FIG. 4B, only the first adjusting layer CBL1 that is mainly aimed at adjusting the mass of the movable weight portion 120 and the third adjusting layer CBL3 that is mainly aimed at adjusting the spring characteristics of the elastic deformable portion 130 are provided. In FIG. 4B, the second adjusting layer CBL2 that is mainly aimed at adjusting the damping coefficient D of the movable electrode portion 140 is not disposed. In this case, the damping coefficient D of the movable electrode portion 140 is determined only by the height h1 of the stacked structure including the wall portions. When there is no need to adjust the damping coefficient of the movable electrode portion 140 with the second adjusting layer CBL2, the structure of FIG. 4B may be adopted.

The structure of the adjusting layer shown in FIG. 4B can be formed by, for example, forming a stacked structure as an adjusting layer and thereafter selectively removing the stacked structure in the capacitance electrode portion (including the movable electrode portion 140 and the fixed electrode portion 150) by anisotropic etching or the like.

Figure 5A:
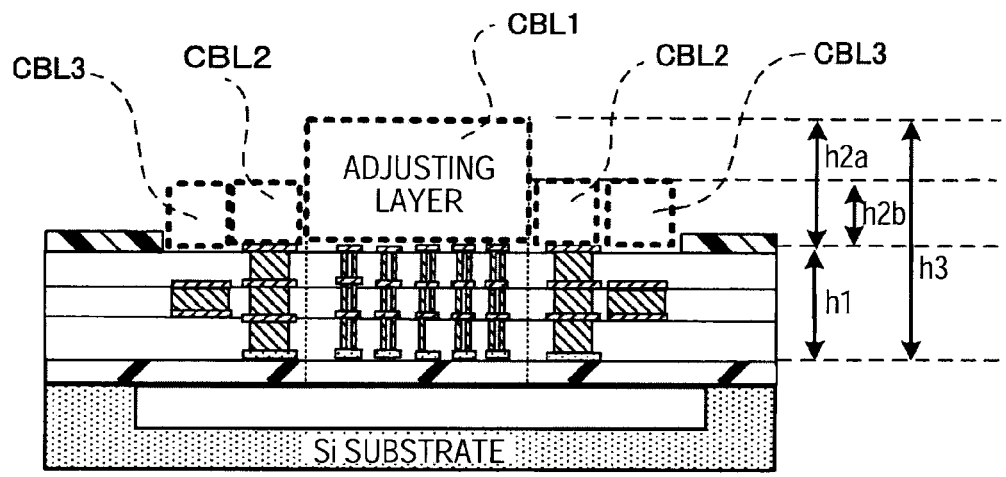
FIGS. 5A and 5B show still other exemplary structures of the adjusting layer.
Figure 5B:
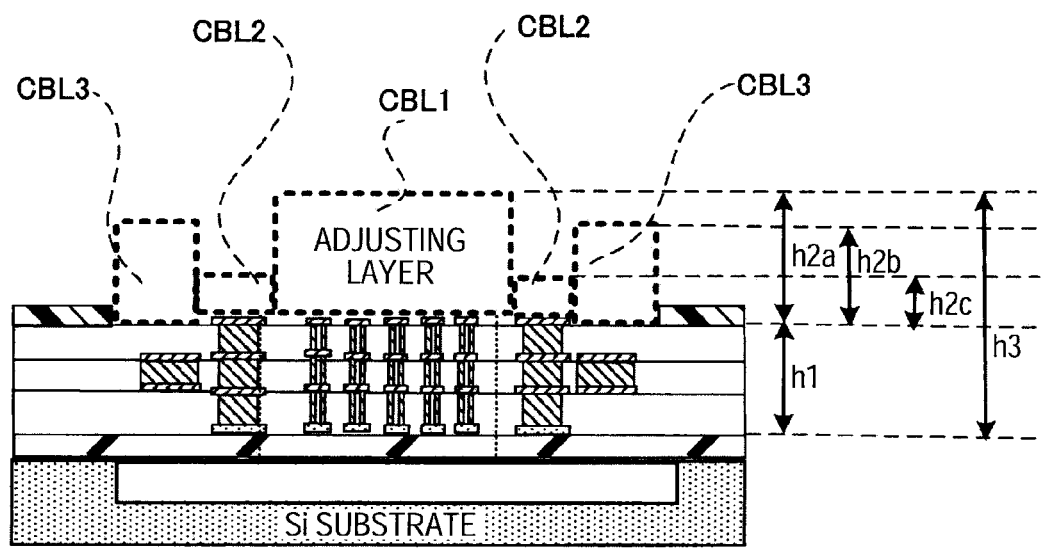

FIGS. 5A and 5B show still other exemplary structures of the adjusting layer. As shown in FIGS. 5A and 5B, the height of one of the first adjusting layer CBL1, the second adjusting layer CBL2, and the third adjusting layer CBL3 can be different from that of at least one of the other two adjusting layers.

In FIG. 5A, the second adjusting layer CBL2 has the same height h2b as that of the third adjusting layer CBL3, and the first adjusting layer CBL1 has a different height h2a from the height h2b of the second adjusting layer CBL2 and the third adjusting layer CBL3. The first adjusting layer CBL1 has the same height as that of the second adjusting layer CBL2, and the first adjusting layer CBL1 and the second adjusting layer CBL2 have a different height from that of the third adjusting layer CBL3, in some cases. Moreover, the first adjusting layer CBL1 has the same height as that of the third adjusting layer CBL3, and the second adjusting layer CBL2 has a different height from that of the first adjusting layer CBL1 and the third adjusting layer CBL3, in some cases.

In FIG. 5B, the respective first to third adjusting layers CBL1 to CBL3 have different heights h2a, h2b, and h2c. According to the modes shown in FIGS. 5A and 5B, the heights of the respective adjusting layers CBL1 to CBL3 can be individually optimized. Accordingly, the degree of design freedom is further improved.

Second Embodiment

In a second embodiment, the structure of an electrostatic capacitive MEMS acceleration sensor will be specifically described. In the embodiment, a MEMS sensor portion and a detection system circuit including a charge amplifier or the like are integrally manufactured by the same manufacturing process.

Before describing a device structure or the like including an adjusting layer, the basic structure of the electrostatic capacitive MEMS acceleration sensor (hereinafter simply referred to as acceleration sensor) according to the embodiment and the configuration of a detection circuit for a physical quantity will be first described by using FIGS. 6 to 10C.

Figure 6:
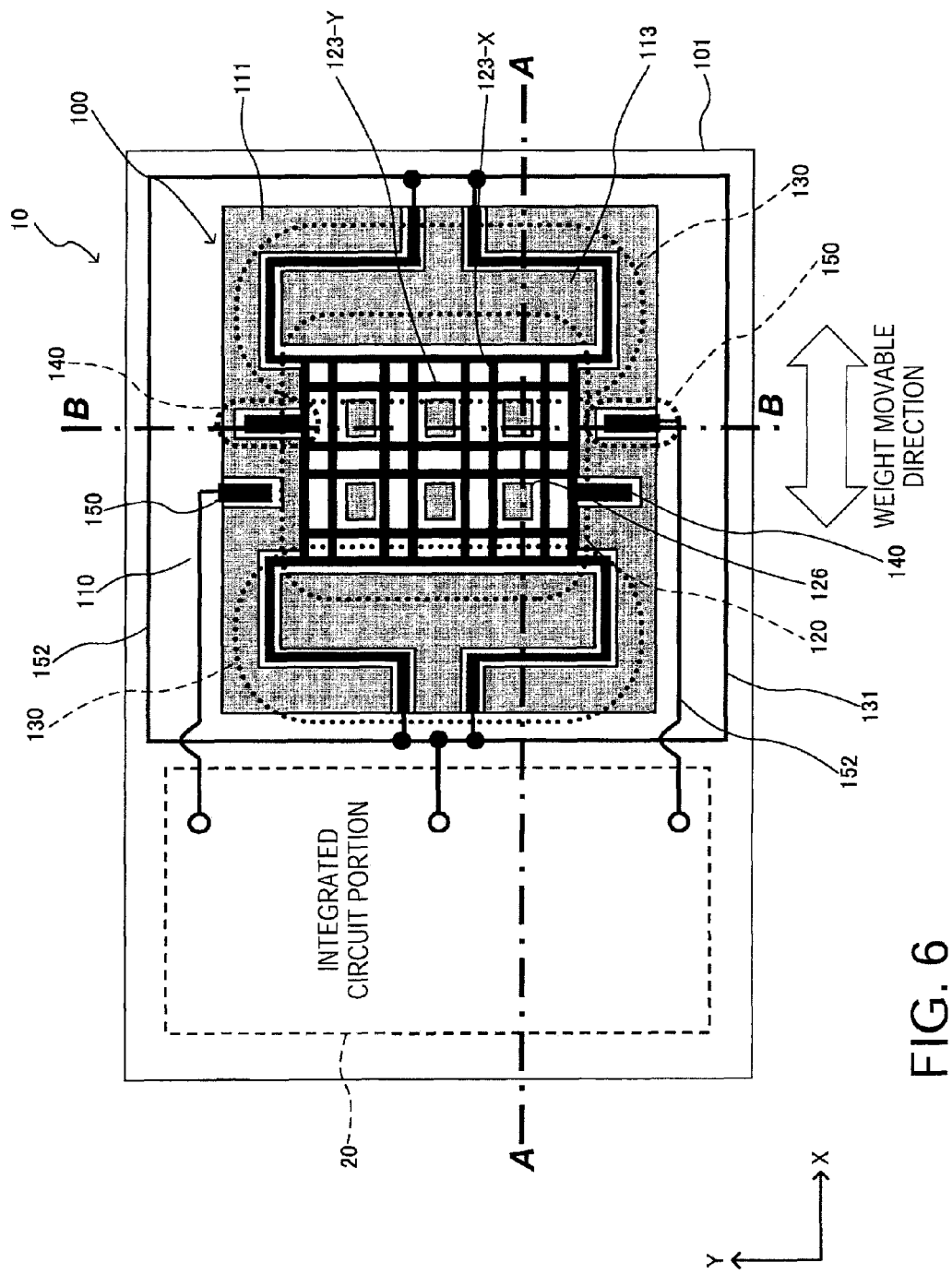
FIG. 6 is a perspective plan view for explaining a basic structure of the MEMS sensor (capacitive acceleration sensor module) of the invention.

FIG. 6 shows a layout example of an acceleration sensor module 10 on which an acceleration sensor 100 is mounted. On the acceleration sensor module 10, an integrated circuit portion 20 is mounted together with the acceleration sensor 100. The acceleration sensor 100 is formed also by using manufacturing process steps of the integrated circuit portion 20.

Structure of Movable Weight Portion 120

The acceleration sensor 100 has the movable weight portion 120 that can move within hollow portions 111 inside the fixed frame portion 110. The movable weight portion 120 is coupled to the fixed frame portion 110 with the elastic deformable portions 130. The movable weight portion 120 has a predetermined mass. When force due to acceleration is generated, the movable weight portion 120 moves in a direction of the force.

Figure 7:
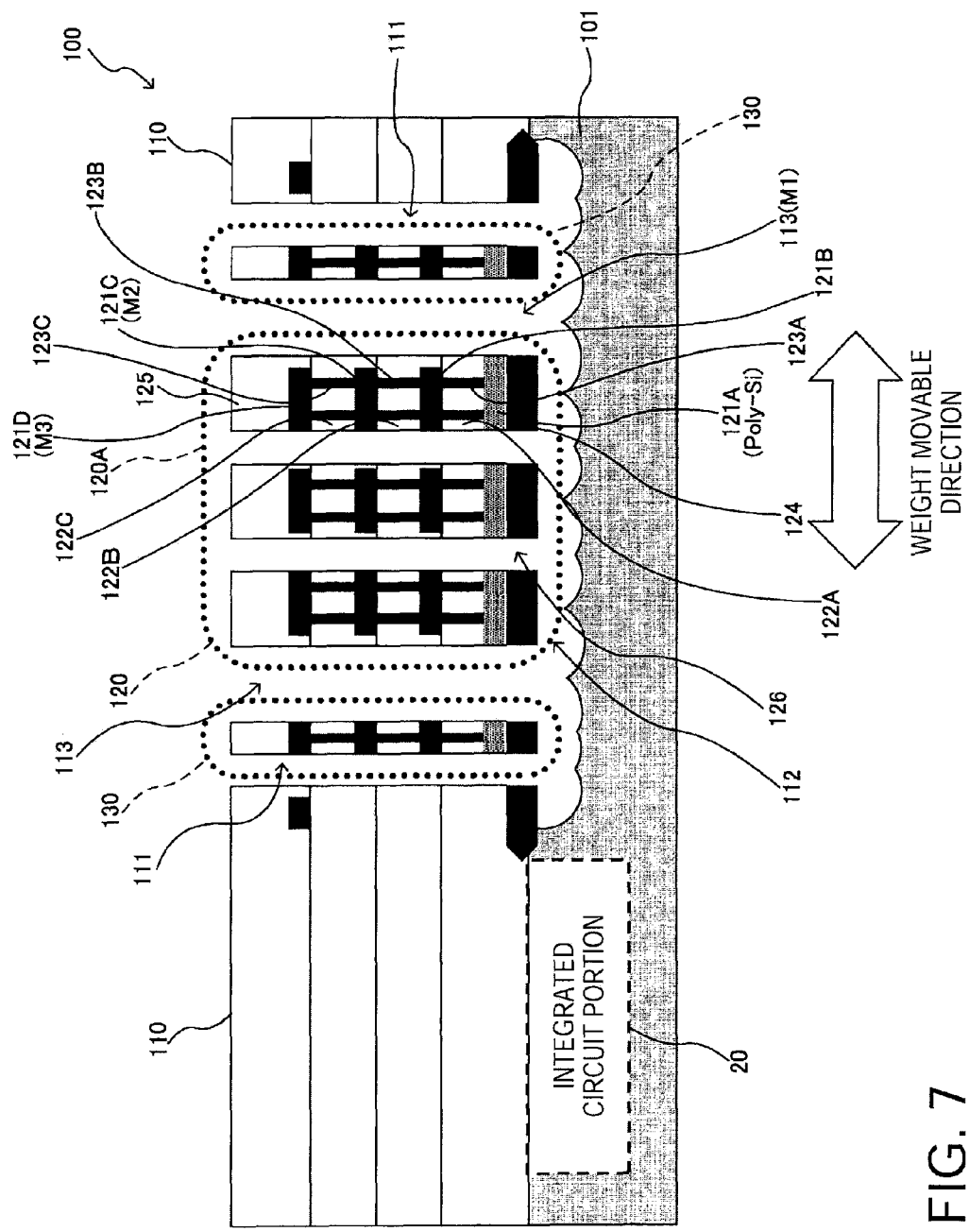
FIG. 7 is a cross-sectional view taken along line A-A of FIG. 6.
Figure 8:
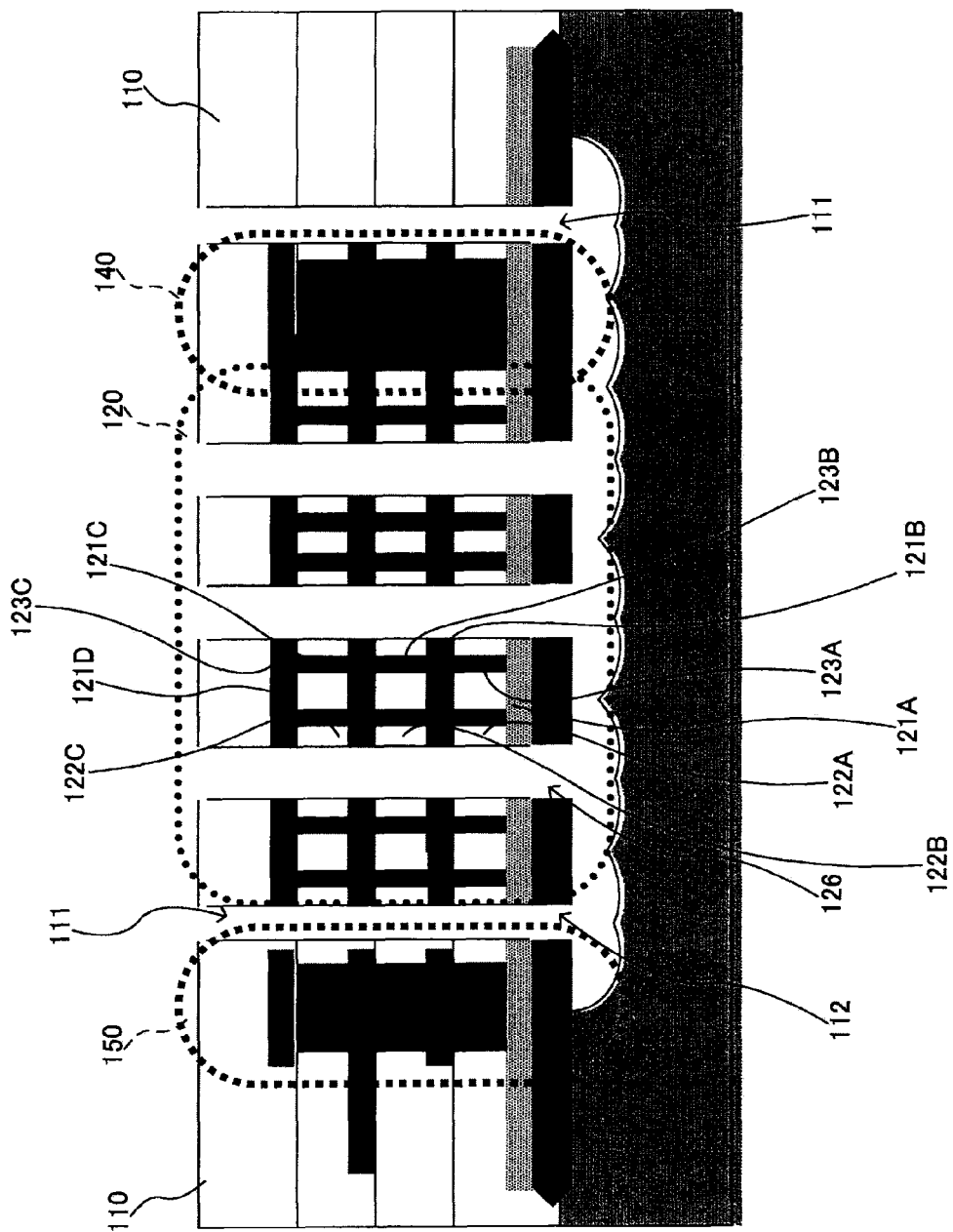
FIG. 8 is a cross-sectional view taken along line B-B of FIG. 6.

As shown in FIG. 7 which is an A-A cross section of FIG. 6, and FIG. 8 which is an B-B cross-sectional view of FIG. 6, the movable weight portion 120 can be configured to include a plurality of conductors 121A to 121D, a plurality of inter-layer insulating layers 122A to 122C disposed between the respective plurality of conductors 121A to 121D, and plugs 123A to 123C filled into predetermined embedding groove patterns formed through the respective plurality of inter-layer insulating layers 122A to 122C. The predetermined embedding groove patterns formed through the respective plurality of inter-layer insulating layers 122A to 122C are grid-like patterns, for example, and the plugs 123A to 123C are formed in a grid. For the material of the plugs 123A to 123C, a necessary condition is that the material is greater in specific gravity than the inter-layer insulating films 122A to 122C. When the plugs 123A to 123C are used also for electrical continuity, a conductive material is used.

In the embodiment, the conductor 121A in the lowermost layer is a polysilicon layer formed on an insulating film 124 on the silicon substrate 101 of the integrated circuit portion 20, while the other three conductors 121B to 121D are metal layers.

The plugs 123A to 123C formed in the respective layers include wall portions formed in a wall shape along one or plurality of longitudinal directions perpendicular to a stacked direction of the layers. As shown in FIG. 6, orthogonal two axes of a two-dimensional surface are defined as an X-direction and a Y-direction. In the embodiment, the plugs 123A to 123C formed in the respective layers include plugs 123-X extending in a wall shape along the X-direction as a longitudinal direction and plugs 123-Y (constituting wall portions) extending in a wall shape along the Y-direction as a longitudinal direction.

As described above, the structure of the movable weight portion 120 of the embodiment includes the plurality of conductors 121A to 121D, the inter-layer insulating layers 122A to 122C, and the plugs 123A to 123C in the same manner as a typical IC cross section. Therefore, the structure can be formed also by using the manufacturing steps of the integrated circuit portion 20. In addition, all the members formed also by using the manufacturing steps of the integrated circuit portion 20 are utilized for contributing to an increase in weight of the movable weight portion 120.

Especially in the movable weight portion 120 formed also by using the IC manufacturing steps, the plugs 123A to 123C formed in the respective layers are devised so as to increase the mass of the movable weight portion 120A. As described above, since the plugs 123A to 123C formed in the respective layers include the two kinds of plug 123-X and plug 123-Y, the respective wall portions of the plug 123-X and the plug 123-Y can increase the weight. The insulating layer 124 is formed below the conductor 121A in the lowermost layer.

For making the movable weight portion 120 movable, a space needs to be formed for the movable weight portion 120 also on the upper and lower sides thereof, in addition to the hollow portions 111 on the sides. Therefore, the silicon substrate 101 below the insulating layer 124 in the lowermost layer of the movable weight portion 120 is removed by etching to form the hollow portion 112.

The movable weight portion 120 has one or plurality of through holes 126 that vertically penetrate therethrough in a region where the plugs 123A to 123C are not formed. The through hole 126 is formed as a gas passage for forming the hollow portion 112 by an etching process. Since the movable weight portion 120A is reduced in weight by the amount of the formed through hole 126, the hole diameter and number of the through holes 126 are determined in such a range that an etching process can be carried out.

Structure of Elastic Deformable Portion (Connection Portion) 130

As described above, for movably supporting the movable weight portion 120 in a region where the hollow portions 111 and the hollow portion 112 are respectively formed on the sides of and below the movable weight portion 120, the elastic deformable portions 130 are disposed. The elastic deformable portion 130 is intervened between the fixed frame portion 110 and the movable weight portion 120. The elastic deformable portion 130 is elastically deformable so as to allow the movable weight portion 120 to move in a weight movable direction (X-direction) in FIG. 6. As shown in FIG. 6, the elastic deformable portion 130 is formed in a loop shape so as to substantially have a constant line width in a plan view and coupled to the fixed frame portion 110. Since an inner hollow portion 113 that is sectioned from the hollow portion 111 is formed, elastic deformability is secured for the elastic deformable portion 130.

In the same manner as the movable weight portion 120, the elastic deformable portion 130 is formed also by using the forming process of the integrated circuit portion 20. That is, the elastic deformable portion 130 can be configured by the plurality of conductors 121A to 121D, the inter-layer insulating layers 122A to 122C, the plugs 123A to 123C, and the insulating layer 124. The elastic deformable portion 130 can be formed of at least one insulating layer and can use one or more conductor layers as an elastic deformable member.

Structure of Capacitance Electrode Portion (Movable Electrode Portion and Fixed Electrode Portion)

In the same manner as the movable weight portion 120, the movable electrode portion 140 and the fixed electrode portion 150 are formed also by using the forming process of the integrated circuit portion 20. As shown in FIG. 8, the movable electrode portion 140 and the fixed electrode portion 150 are configured to include the plurality of conductors 121A to 121D, the inter-layer insulating layers 122A to 122C, the plugs 123A to 123C, the insulating layer 124, and a protective layer 125. However, only the wall portion (wall-shaped plug) configured by a conductor functions as an electrode of a capacitor.

Configuration Example of Acceleration Sensor Module and C/V Conversion Circuit

Figure 9:
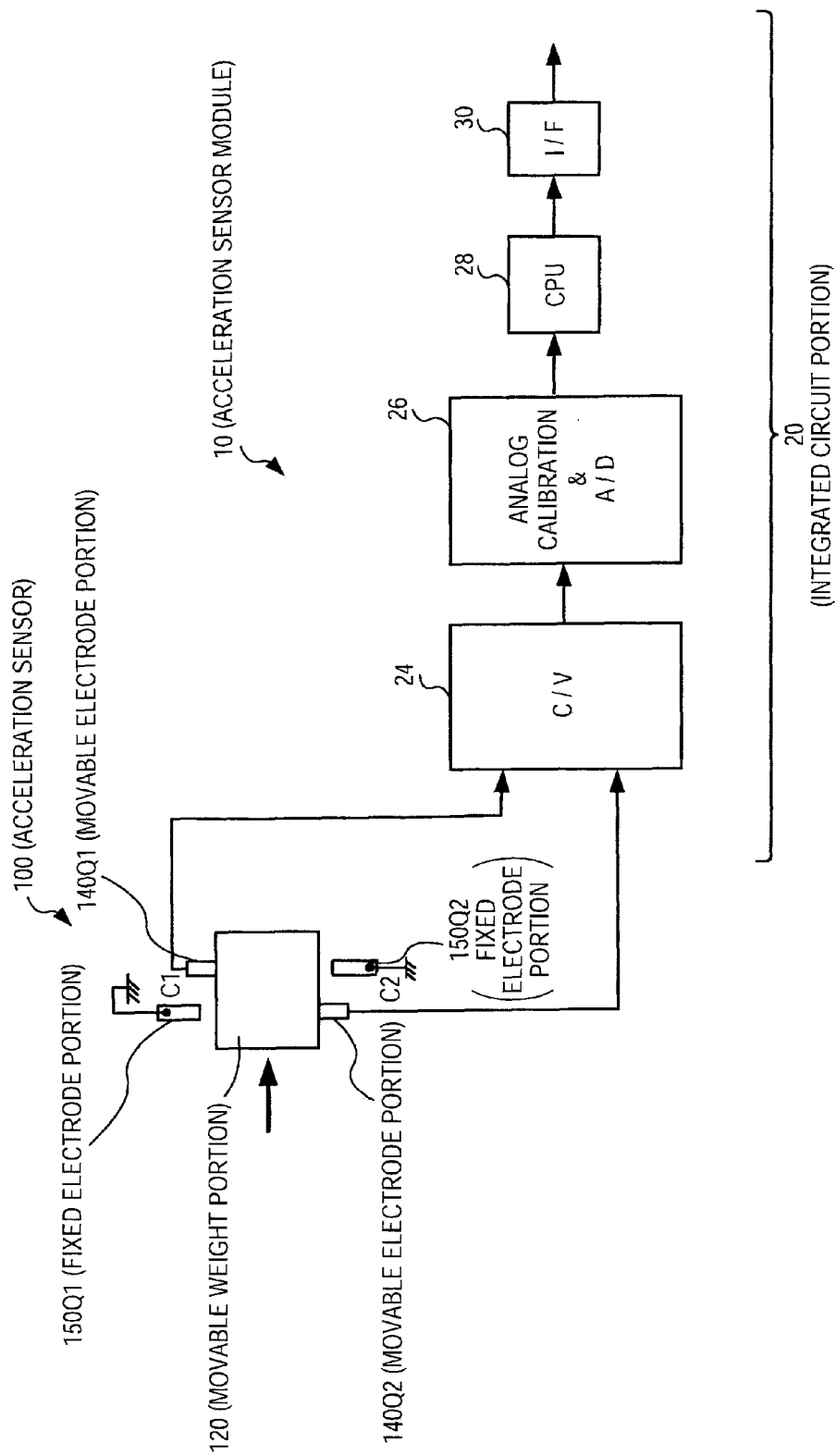
FIG. 9 is a block diagram of an exemplary circuit (including a C/V conversion circuit) mounted on the acceleration sensor module.

FIG. 9 is a block diagram of the acceleration sensor module 10 of the embodiment. The acceleration sensor 100 has at least two movable and fixed electrode pairs. In FIG. 9, the acceleration sensor 100 has a first movable electrode portion 140Q1, a second movable electrode portion 140Q2, a first fixed electrode portion 150Q1, and a second fixed electrode portion 150Q2. The first movable electrode portion 140Q1 and the first fixed electrode portion 150Q1 constitute a capacitor C1. The second movable electrode portion 140Q2 and the second fixed electrode portion 150Q2 constitute a capacitor C2. The potential of one electrode (for example, fixed electrode portion) of each of the capacitors C1 and C2 is fixed to a reference potential (for example, ground potential). Here, the potential of the movable electrode portion may be fixed to a ground potential.

The integrated circuit portion 20 formed by, for example, a CMOS process includes, for example, a C/V conversion circuit 24, an analog calibration and A/D conversion circuit unit 26, a central processing unit (CPU) 28, and an interface (I/F) circuit 30. However, this configuration is an example and is not restrictive. For example, the CPU 28 can be replaced by control logic, and the A/D conversion circuit can be disposed at the output stage of the C/V conversion circuit 24. The analog/digital conversion circuit and the CPU may be disposed by using a different integrated circuit from the integrated circuit portion 20 depending on the case.

When acceleration acts on the movable weight portion 120 in a state where the movable weight portion 120 is stopped, force due to the acceleration acts on the movable weight portion 120 to change each of gaps of the movable and fixed electrode pairs. When it is assumed that the movable weight portion 120 is moved in a direction of arrow in FIG. 9, the gap between the first movable electrode portion 140Q1 and the first fixed electrode portion 150Q1 is increased, and the gap between the second movable electrode portion 140Q2 and the second fixed electrode portion 150Q2 is decreased. Since the gap and the capacitance are in an inverse relation, the capacitance value C1 of the capacitor C1 formed of the movable electrode portion 140Q1 and the fixed electrode portion 150Q1 becomes small, and the capacitance value C2 of the capacitor C2 formed of the movable electrode portion 140Q2 and the fixed electrode portion 150Q2 becomes great.

Along with the change in capacitance values of the capacitors C1 and C2, the movement of charge occurs. The C/V conversion circuit 24 has a charge amplifier using, for example, a switched capacitor. The charge amplifier converts a minute current signal caused by the movement of charge into a voltage signal by sampling operation and integration (amplification) operation. A voltage signal (that is, a physical quantity signal detected by the physical quantity sensor) output from the C/V conversion circuit 24 is subjected to calibration processing (for example, adjustment of phase or signal amplitude, and low-pass filter processing may be further performed) by the analog calibration and A/D conversion circuit unit 26, and thereafter converted from an analog signal to a digital signal.

By using FIGS. 10A to 10C, the configuration and operation of the C/V conversion circuit 24 will be described. FIG. 10A shows the basic configuration of a charge amplifier using a switched capacitor. FIG. 10B shows voltage waveforms of respective parts of the charge amplifier shown in FIG. 10A.

As shown in FIG. 10A, the C/V conversion circuit basically has a first switch SW1 and a second switch SW2 (constituting a switched capacitor of an input part together with a variable capacitance C1 (or C2)), an operational amplifier OPA1, a feedback capacitance (integral capacitance) Cc, a third switch SW3 for resetting the feedback capacitance Cc, a fourth switch SW4 for sampling an output voltage Vc of the operational amplifier OPA1, and a holding capacitance Ch.

As shown in FIG. 10B, the on/off of the first switch SW1 and the third switch SW3 is controlled by a first clock of the same phase, and the on/off of the second switch SW2 is controlled by a second clock having an opposite phase from the first clock. The fourth switch SW4 is briefly turned on at the end of a period in which the second switch SW2 is turned on. When the first switch SW1 is turned on, a predetermined voltage Vd is applied to both ends of the variable capacitance C1 (C2), so that charge is accumulated in the variable capacitance C1 (C2). In this case, the feedback capacitance Cc is in a reset state (state of being short-circuited between both ends) because the third switch is in the on state. Next, the first switch SW1 and the third switch SW3 are turned off, and the second switch SW2 is turned on, the both ends of the variable capacitance C1 (C2) are at a ground potential. Therefore, the charge accumulated in the variable capacitance C1 (C2) moves toward the operational amplifier OPA1. In this case, since the charge amount is stored, a relation of Vd·C1 (C2)=Vc·Cc is established. Accordingly, the output voltage Vc of the operational amplifier OPA1 is expressed by (C1/Cc)·Vd. That is, the gain of the charge amplifier is determined by the ratio between the capacitance value of the variable capacitance C1 (or C2) and the capacitance value of the feedback capacitance Cc. Next, when the fourth switch (sampling switch) SW4 is turned on, the output voltage Vc of the operational amplifier OPA1 is held by the holding capacitance Ch. Vo denotes the held voltage. The voltage Vo serves as the output voltage of the charge amplifier.

As shown in FIG. 9, the C/V conversion circuit 24 actually receives differential signals from the two capacitors C1 and C2. In this case, as the C/V conversion circuit 24, a differential charge amplifier shown in FIG. 10C can be used, for example. In the charge amplifier shown in FIG. 10C, in the input stage, a first switched-capacitor amplifier (SW1a, SW2a, OPA1a, Cca, and SW3a) for amplifying a signal from the variable capacitance C1 and a second switched-capacitor amplifier (SW1b, SW2b, OPA1b, Ccb, and SW3b) for amplifying a signal from the variable capacitance C2 are disposed. Respective output signals (differential signals) of the operational amplifiers OPA1a and OPA1b are input to a differential amplifier (OPA2 and resistances R1 to R4) disposed in the output stage. As a result, the output signal Vo amplified is output from the operational amplifier OPA2. The use of the differential amplifier provides an effect that base noises can be removed.

The above-described configuration of the C/V conversion circuit is an example, and the C/V conversion circuit is not restricted to the configuration. In FIG. 10C, only the two movable and fixed electrode pairs are shown for the convenience of description. However, this is not restrictive. The number of electrode pairs can be increased corresponding to a required capacitance value. Actually, from several tens to several hundreds of electrode pairs are disposed, for example. In the above example, although the gap between the electrodes is changed in the capacitors C1 and C2 to change the capacitance of each of the capacitors, this is not restrictive. A configuration can be adopted in which the facing areas of two movable electrodes with respect to one reference electrode are changed to change the capacitances of the two capacitors C1 and C2 (this configuration is effective when acceleration acting in, for example, a Z-axis direction (direction perpendicular to the substrate) is detected).

In the case of adopting the configuration in FIG. 9, it is necessary to take out signals electrically independent of each other from the movable electrode portions 140Q1 and 140Q2 (that is, it is necessary that respective potentials of the two movable electrode portions 140Q1 and 140Q2 should be independent of each other). This configuration can be realized by adopting a structure shown in FIGS. 17A to 17C, for example.

FIGS. 17A to 17C show a structure example for giving independent potentials to two wall-shaped electrode portions in a movable electrode portion. FIG. 17A shows a wall-shaped electrode structure (electrode structure of wall portion) in the movable electrode portion 140. FIG. 17B shows the wall-shaped electrode structure shown in FIG. 17A as viewed from a perspective perpendicular to the perspective of FIG. 17A. As shown in FIG. 17B, two wall-shaped electrode portions DA and DB, which are electrically independent of each other (that is, they are not connected to each other), are formed in the movable electrode portion 140. Accordingly, when the movable electrode portion 140 and the fixed electrode portions 150 are arranged as shown in FIG. 17C for example, the two capacitors C1 and C2 that are electrically independent of each other can be configured without laboring while saving space. VA and VB denote respective potentials of the two capacitors C1 and C2.

Specific Example of Device Structure Including Adjusting Layer

The MEMS sensor (acceleration sensor) according to the embodiment has an adjusting layer in addition to the basic structure described by using FIGS. 6 to 8.

Figure 11A:
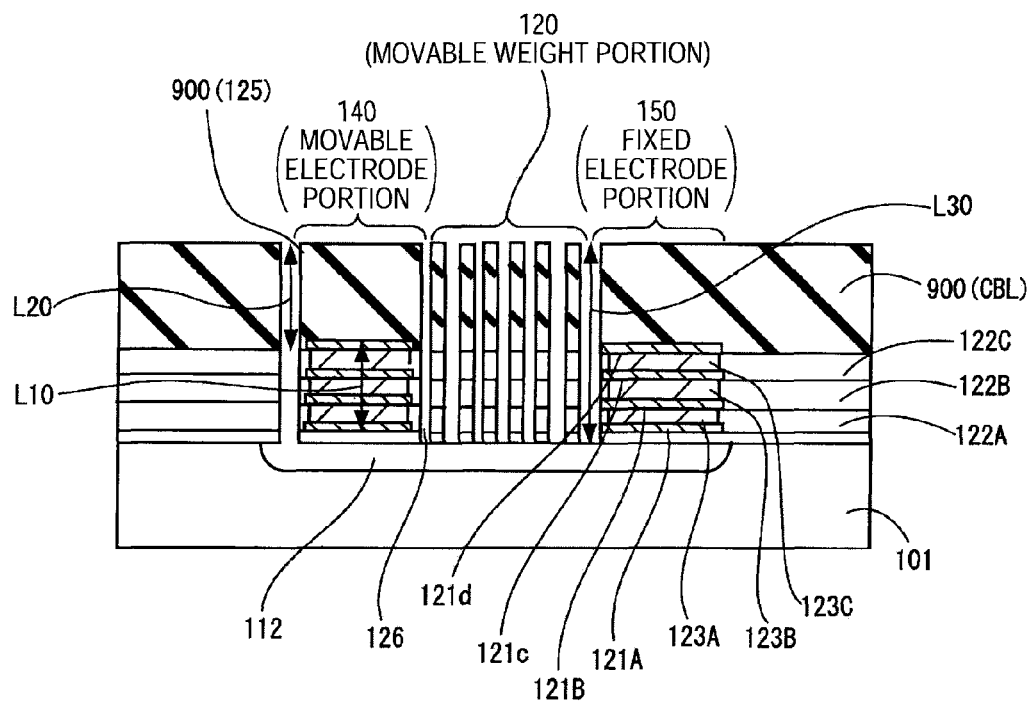
FIGS. 11A and 11B show exemplary adjusting layers used in the acceleration sensor module.
Figure 11B:
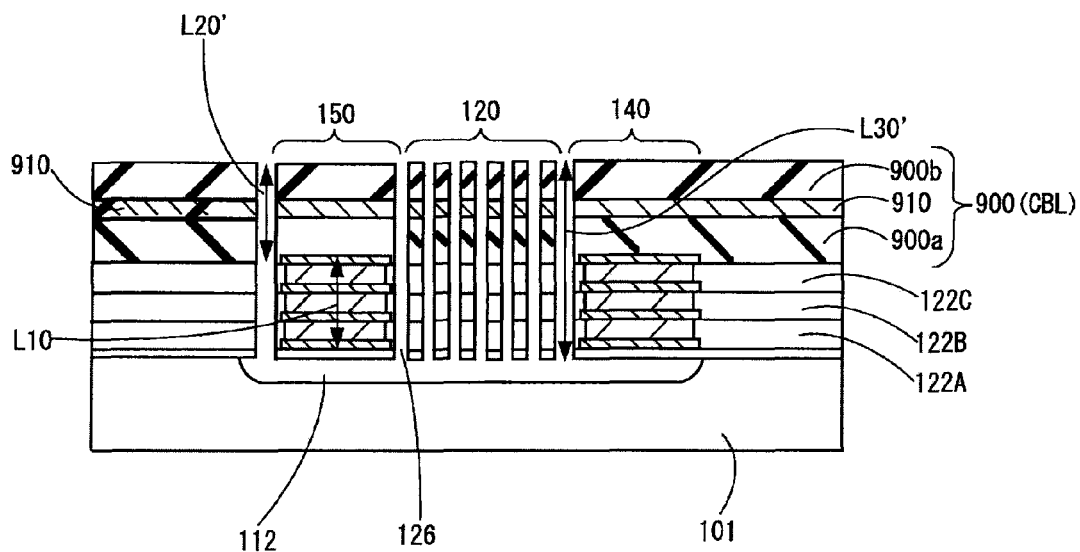

FIGS. 11A and 11B show exemplary adjusting layers used in the acceleration sensor module. In FIGS. 11A and 11B, the movable weight portion 120 is shown at the center (conductors are not illustrated in the movable weight portion 120 for convenience), the fixed electrode portion 150 is shown on the right, and the movable electrode portion 140 is shown on the left.

In FIG. 11A, an insulating layer 900 is the adjusting layer CBL. The adjusting layer 900 (CBL) functions also as a protective film. The electrode portion (conductor) has a height L10. The adjusting layer 900 (CBL) has a height L20. The movable weight portion 120 has a height L30 as a whole.

In FIG. 11B, the adjusting layer 900 (CBL) is configured by two insulating layers 900a and 900b and an isolated conductor 910. That is, in FIG. 11B, an isolated conductor (conductor giving no influence on the electrical characteristics of the electrode portion) is utilized as the adjusting layer 900 (CBL), in addition to the insulating layers. In this case, since a conductive material is greater in specific gravity than an insulating material, the weight density of the adjusting layer can be effectively increased. Accordingly, an effect of increasing the mass of the movable weight portion is enhanced. The electrode portion (conductor) has the height L10. The adjusting layer 900 (CBL) has a height L20'. The movable weight portion 120 has a height L30' as a whole.

Figure 12:
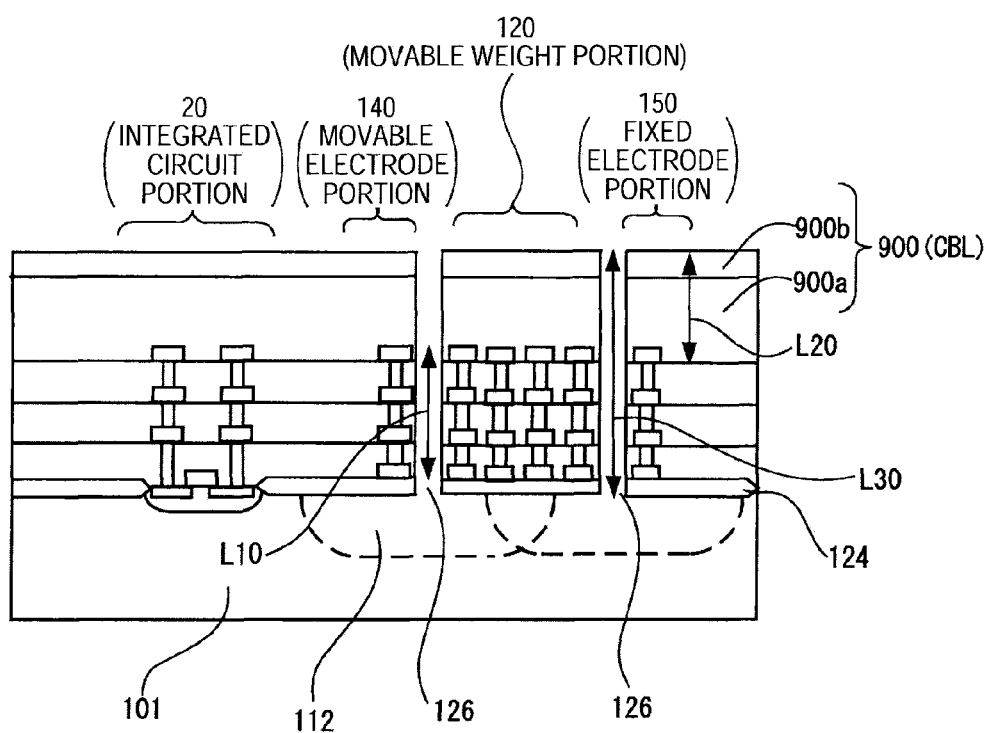
FIG. 12 shows another exemplary adjusting layer used in the acceleration sensor module.
Figure 13:
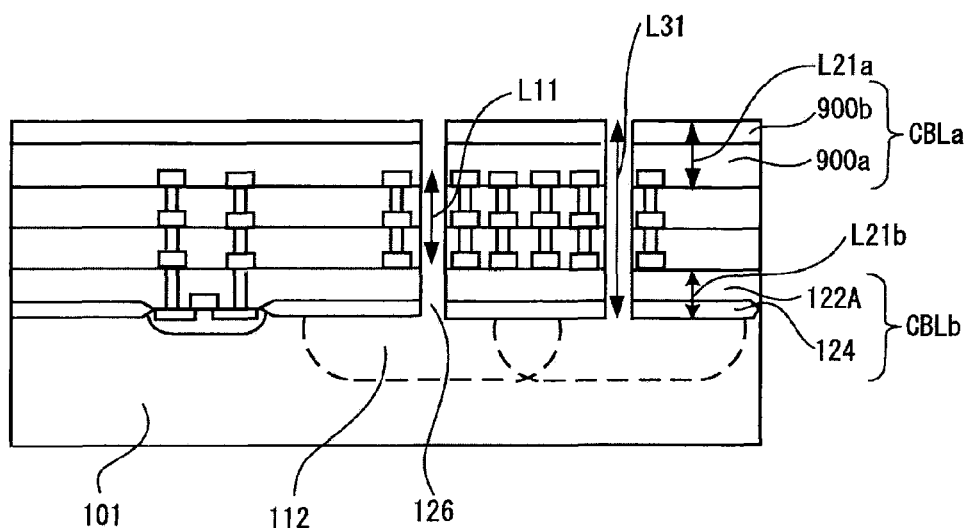
FIG. 13 shows still another exemplary adjusting layer used in the acceleration sensor module.

FIGS. 12 and 13 show other exemplary adjusting layers used in the acceleration sensor module. As described before, the adjusting layer 900 (CBL) can be disposed on the stacked structure including the wall portions serving as electrodes of a capacitor (in the case of FIG. 12) and can be disposed below the stacked structure. Moreover, the adjusting layer 900 (CBL) can be disposed both on and below the stacked structure (in the case of FIG. 13). In FIG. 13, CBLa denotes an upper adjusting layer, while CBLb denotes a lower adjusting layer.

In the case of FIG. 12, the electrode portion (conductor) has the height L10, the adjusting layer 900 (CBL) has the height L20, and the movable weight portion 120 has the height L30. In the case of FIG. 13, the electrode portion (conductor) has a height L11, the upper adjusting layer CBLa has a height L21a, the lower adjusting layer CBLb has a height L21b, and the movable weight portion 120 has a height L31.

Third Embodiment

Figure 14:
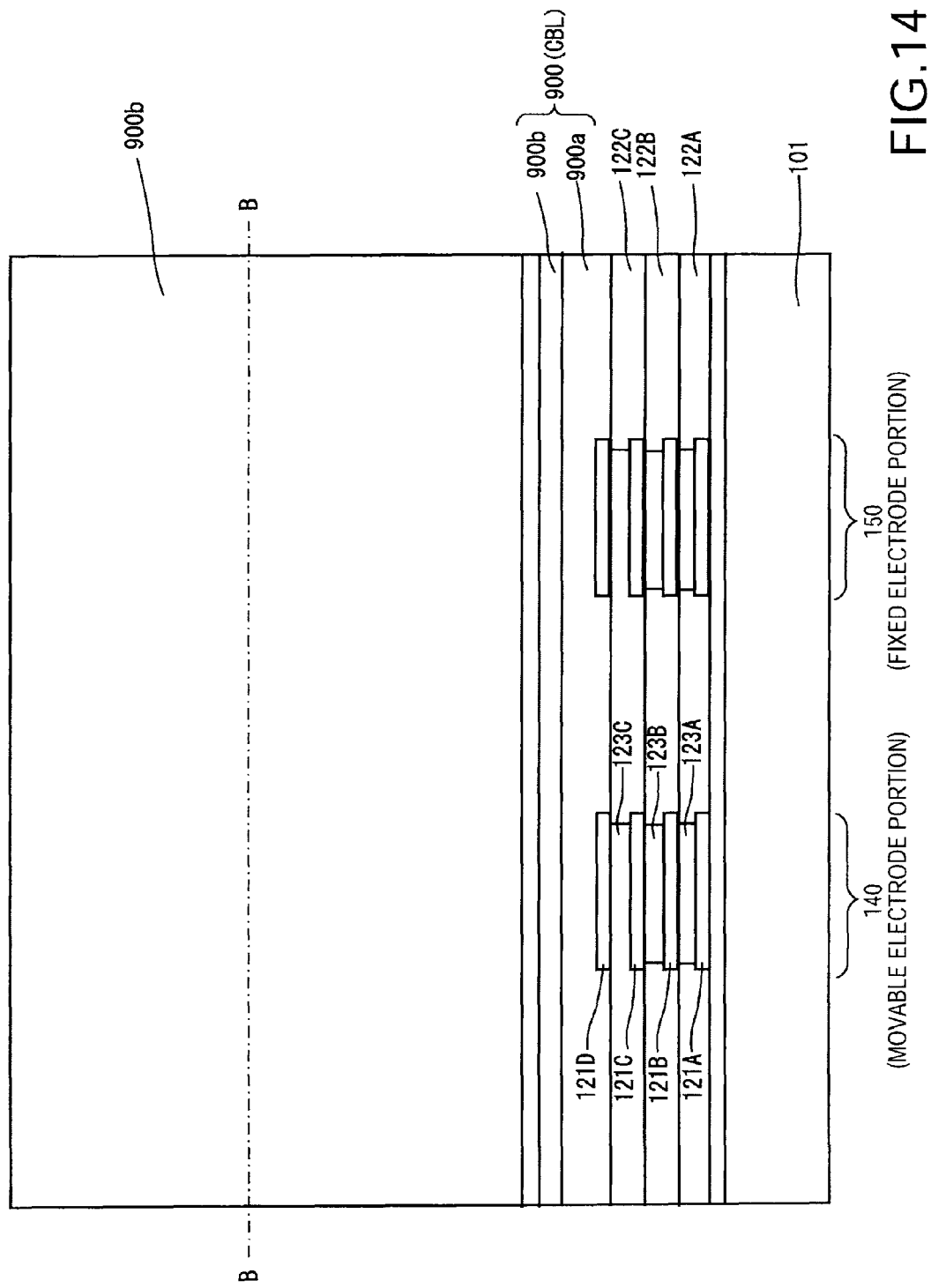
FIG. 14 explains a manufacturing step (step 1) of the acceleration sensor module.

In a third embodiment, a method for manufacturing the MEMS sensor will be described with reference to FIGS. 14 to 16. FIG. 14 shows a state where a multi-layer wiring structure (multi-layer stacked structure including an adjusting layer) is completed (that is, the integrated circuit portion 20 of FIG. 6 is completed, but an etching process in the acceleration sensor 100 is not carried out).

Figure 15:
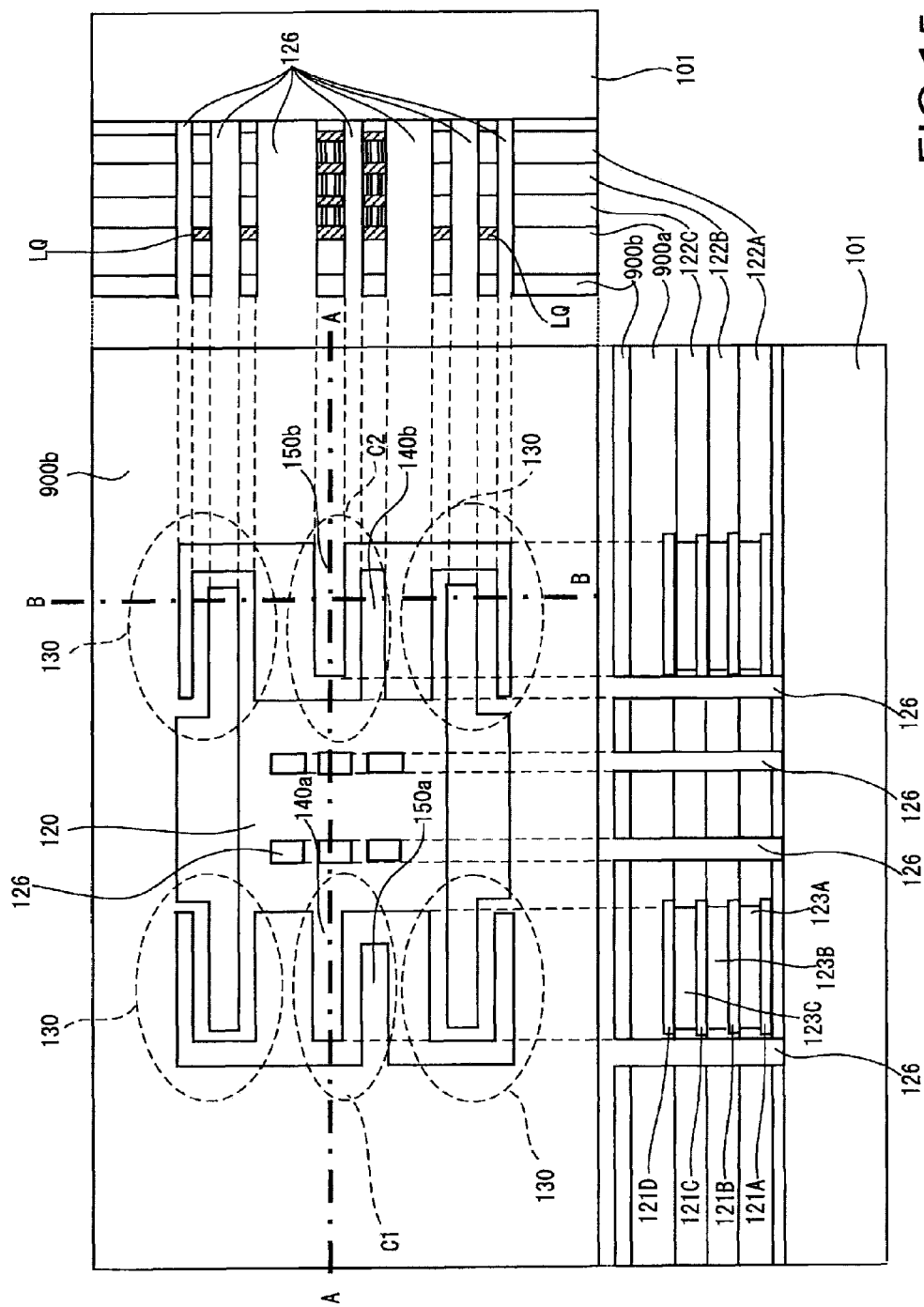
FIG. 15 explains a manufacturing step (step 2) of the acceleration sensor module.

FIG. 15 shows a state where the first hollow portions 126 are formed through the multi-layer wiring structure (multi-layer stacked structure) (plan view, cross-sectional view in a lateral direction, and cross-sectional view in a vertical direction of the device).

In FIG. 15, the multi-layer wiring structure is selectively etched by anisotropic etching. With this etching, the first hollow portions 126 as openings to expose the surface of the substrate 101 are formed. For example, the etching step is insulating film anisotropic etching in which the ratio (H/D) of an etching depth (for example, 4 to 6 μm) to an opening diameter D (for example, 1 μm) is a high aspect ratio. With this anisotropic etching, the multi-layer wiring structure (multi-layer stacked structure) can be separated into the fixed frame portion 110, the movable weight portion 120, and the elastic deformable portions 130. The anisotropic etching may be carried out on the same conditions as those for etching an inter-layer insulating film between wiring layers in a CMOS IC, for example. Processing can be carried out by performing dry etching using, for example, a mixed gas of $CF_4$, $CHF_3$, and the like. In FIG. 15, a lead wire LQ connected to the electrodes of the capacitor is disposed in the uppermost layer of the elastic deformable portion 130.

Figure 16:
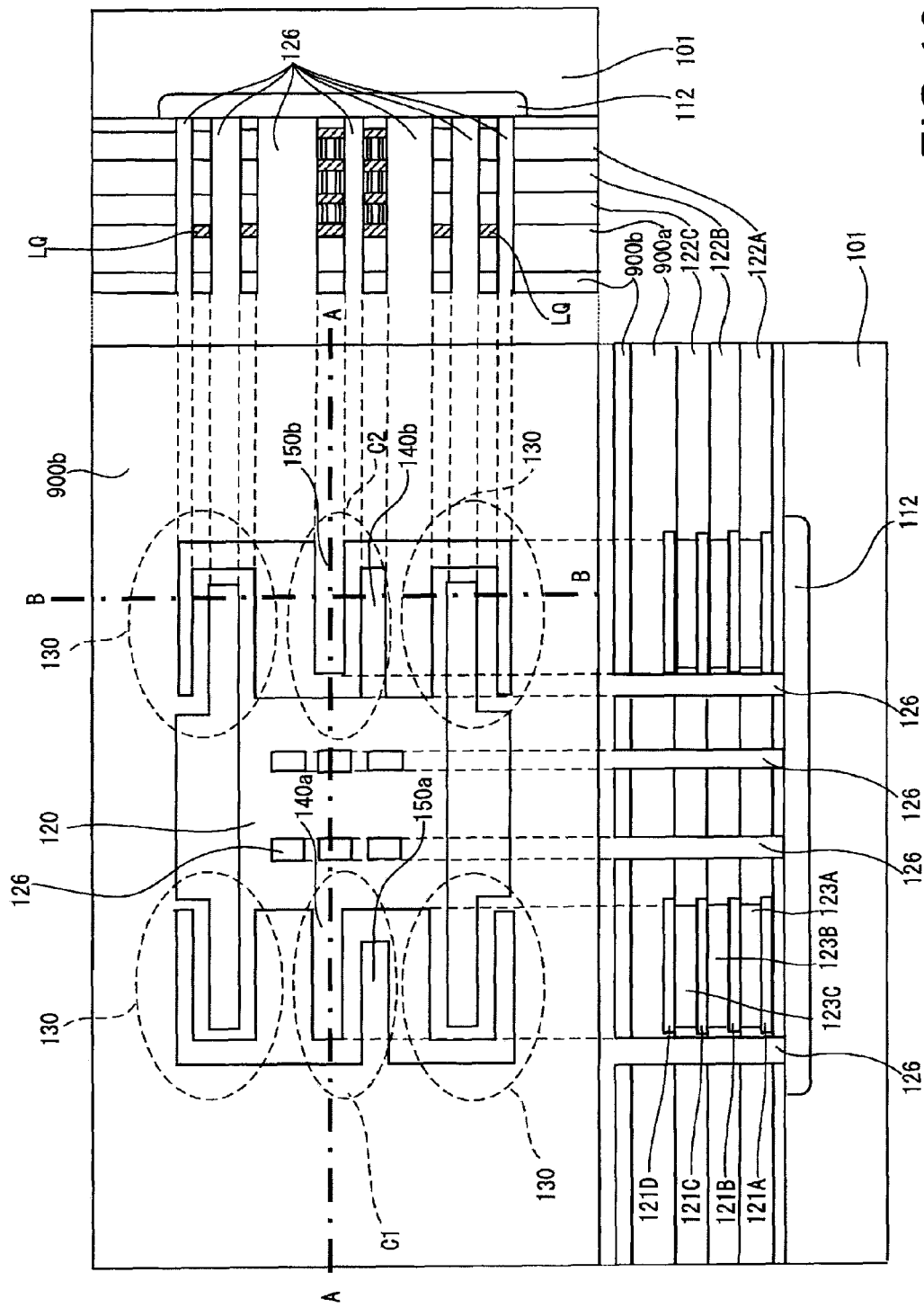
FIG. 16 explains a manufacturing step (step 3) of the acceleration sensor module.

FIG. 16 shows a state where the second hollow portion 112 is formed in the substrate 101. The second hollow portion 112 is formed below the movable weight portion 120 and below the elastic deformable portions 130. In the step of FIG. 16, an etchant for isotropic etching is introduced via the first hollow portions (openings) 126 formed through the multi-layer wiring structure (multi-layer stacked structure), so that the silicon substrate 101 is isotropically etched. With this etching, the second hollow portion 112 is formed below the movable weight portion 120, the elastic deformable portions 130, and the movable electrode portion 140.

As the isotropic silicon etching method, there is a method in which an etching gas $XeF_2$ is introduced to a wafer disposed in an etching chamber. The etching gas needs not to be plasma excited, so that gas etching is possible. Like an example disclosed in JP-A-2002-113700, for example, an etching process at a pressure of 5 kPa can be performed with $XeF_2$. Moreover, $XeF_2$ has a vapor pressure of about 4 Torr, and etching is possible at or below the vapor pressure. Also an etching rate of 3 to 4 μm/min can be expected. In addition, ICP etching can be used. For example, when a mixed gas of $SF_6$ and $O_2$ is used, a pressure in the chamber is set to 1 to 100 Pa, and a RF power of about 100 W is supplied, etching of 2 to 3 μm is completed in several minutes.

Exemplary Effects Obtained by Using Adjusting Layer

As an example, when adjustment is made only with a lateral width (length in a lateral direction) La of the electrode portion without using the adjusting layer according to the invention for realizing a resonant frequency of 3 kHz and a Q value of 1 as design values with the dimension of the movable weight portion (square shape) being 800 μm×500 μm, the gap d between the electrodes being 2 μm, and the height h of the electrode portion (conductor) (L2 in FIGS. 5A and 5B) being 5 μm, the value of La is about 800 μm, which is extremely long. At the same time, a relation of electronic spring characteristics<<mechanical spring characteristics cannot be satisfied. Accordingly, it is difficult to actually use the device as an acceleration sensor.

On the other hand, when the thickness (for example, L20 in FIG. 11A) of the adjusting layer 900 (CBL) is set to 5 μm, and an $SiO_2$ film is used as an insulating film constituting the adjusting layer 900 (CBL), the value of the lateral width (length in a lateral direction) La of the electrode portion is about 130 μm, which falls within a feasible length (within an appropriate range usable in a usual design). At the same time, the relation of electronic spring characteristics<<mechanical spring characteristics can be satisfied, so that the influence of electronic spring characteristics is negligible.

Description of Design Parameters, Etc. of MEMS Sensor

A sensitivity S of the MEMS sensor is expressed by S=C0/d0·(M/K) [F/(m/sec²)] where C0 is the entire capacitance of the electrode capacitor, K is the spring constant of the elastic deformable portion 130, and d0 is the gap between the electrodes. That is, as the mass of the movable weight portion 120 increases, the sensitivity improves.

Figure 19:
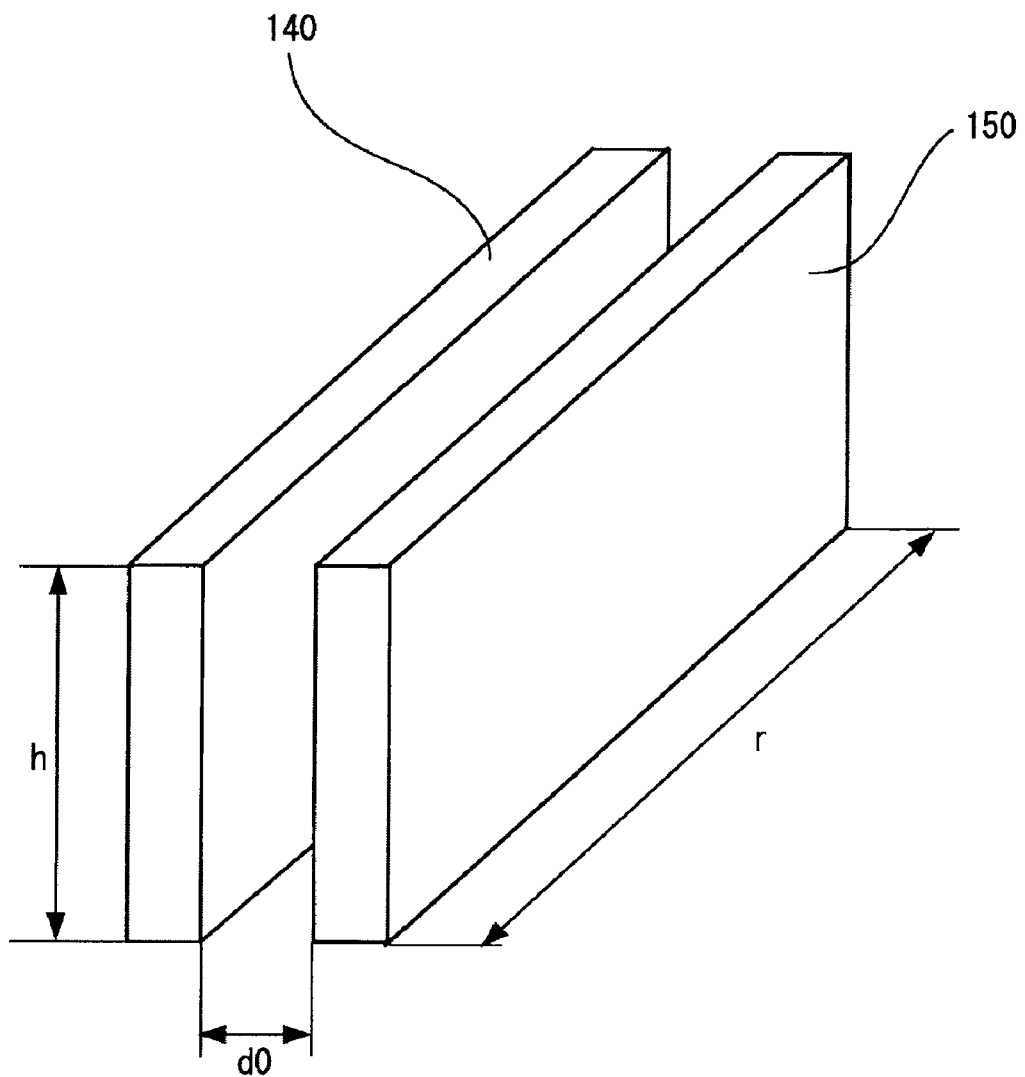
FIG. 19 explains dimensions of a movable electrode portion and a fixed electrode portion relating to a damping coefficient and the Brownian noise.

Next, FIG. 19 is referred to. In FIG. 19, the movable electrode portion 140 and the fixed electrode portion 150 are arranged to face each other, in which the height is defined as h, the length in a lateral direction is defined as r, and the gap between the electrodes is defined as d0. When the gap d0 of the capacitor is changed due to the movement of the movable electrode portion 140, the gas between the electrodes moves vertically. At that time, damping (action to stop the vibration of the movable electrode portion) occurs for the movement of the movable electrode portion 140 due to the viscosity of the gas (air). The damping coefficient D representing the magnitude of damping is expressed by D=n·μ·r (h/d0)³ [N·sec/m] where n is the number of pairs of electrodes (number of pairs of electrodes configured by a fixed electrode and a movable electrode), and μ is the viscosity coefficient of the gas.

That is, the damping coefficient D increases with the cube of the height h of the electrode portion. Force acts on the movable electrode portion due to the Brownian motion of the gas, which serves as the Brownian noise equivalent acceleration. The Brownian noise (BNEA) is expressed by BNEA=(√(4 kBTD))/M [(m/sec²)/√Hz]. The numerator of the equation is proportional to the square root of the damping coefficient D that is proportional to the cube of the height h of the movable electrode portion. Therefore, even when the mass M increases, the Brownian noise increases in the event.

The MEMS sensor is a structure expressed by an equation of motion of free vibration with viscous damping (for example, refer to the following equation (1)). Therefore, the Q value and resonant frequency (natural frequency) of the structure need to be designed to a favorable value. A resonant frequency (natural frequency) ω of the structure that performs free vibration with viscous damping is uniquely determined by the mass M of the movable weight portion and the spring constant K of the spring (elastic deformable portion) supporting the movable weight portion (for example, refer to the following equation (2)). The Q value representing a resonance sharpness is determined by a calculation equation to which the damping constant D is further added (for example, refer to the following equation (3)). In the equation (3), $\xi$ denotes a critical damping coefficient.

[su 1]

$$M\ddot{X} + D\dot{X} + KX = 0 \tag{1}$$

$$\omega = \sqrt{\frac{K}{M}} \tag{2}$$

$$Q = \frac{1}{2\xi} = \frac{\sqrt{MK}}{D} \tag{3}$$

As is apparent from the equation (3), as the mass M of the movable weight portion increases, the Q value increases. As the damping coefficient D increase, the Q value decreases. When the height of the stacked structure (that is, the height of the movable electrode portion) is simply increased for increasing the mass M, it is difficult to maintain the Q value at a desired value because the damping coefficient D increases with the cube of the height of the movable electrode portion.

As described above, the value of spring constant in the elastic deformable portion (spring portion) needs to be confined in an appropriate range. An effective spring constant is not determined only by the mechanical spring constant of the elastic deformable portion (spring portion) but comprehensively determined also by considering an electronic spring constant due to static electricity force (the Coulomb force) acting between the fixed electrode portion 150 and the movable electrode portion 140. That is, an effective spring constant is determined by (mechanical spring constant-electronic spring constant). An electronic spring constant has a nonlinear value with respect to a distance (displacement amount).

Accordingly, the equation of linear spring characteristics expressed by F=kX (F is force, k is a spring constant, and X is a displacement amount) is not established unless the electronic spring constant is designed so as to be sufficiently smaller than the mechanical spring constant.

As described above, the MEMS sensor needs to be designed while comprehensively considering the respective characteristics of the movable weight portion, the electrode portion, and the elastic deformable portion. In the invention, the adjusting layer is introduced as a new design parameter, so that the degree of design freedom is increased. For example, the mass M of the movable weight portion and the damping coefficient D in the movable electrode portion can be separately controlled independently. In this case, the damping coefficient D in the movable electrode portion is also easily set to an appropriate value while maintaining the Q value at an appropriate value. At the same time, required spring characteristics can be provided. According to any of the embodiments of the invention, therefore, a MEMS sensor that is small and has practical characteristics, for example, can be realized.

Although the invention has been described by using the embodiments, the invention is not restricted thereto. Those skilled in the art should readily understand that many modifications can be made within a range not departing from the technical idea of the invention. Accordingly, those modifications are also included in the scope of the invention. For example, a term described at least once with a different term with a broader sense or the same meaning in the specification or the accompanying drawings can be replaced with the different term in any part of the specification or the accompanying drawings.

For example, the MEMS sensor according to the invention is not necessarily applied to an electrostatic capacitive acceleration sensor but can be applied to a piezo-resistive acceleration sensor. Moreover, the MEMS sensor is applicable as long as the sensor is a physical sensor that detects change in capacitance based on the movement of a movable weight portion. For example, the MEMS sensor can be applied to a gyro sensor, a pressure sensor, or the like. Moreover, the detection axis of physical quantity is not restricted to the uni-axial or a bi-axial direction, but a tri- or more multi-axial direction may be adopted. Moreover, a method can be adopted in which a physical quantity is detected based on change in facing area between electrodes of a capacitor.

The present invention is not limited to this; the MEMS sensor also can be used for electronic device such as a digital camera, a car navigation system, a mobile phone, a mobile personal computer, a game controller. According to this structure, it is able to improve detection sensitivity by the MEMS sensor.

The entire disclosure of Japanese Patent Application No. 2009-077454, filed Mar. 26, 2009 and No. 2010-058818, filed Mar. 16, 2010 are expressly incorporated by reference herein.

What is claimed is:

1. A MEMS sensor comprising:
  a support portion;
  a movable weight portion;
  an elastically deformable connection portion connecting the support portion and the movable weight portion;
  a fixed electrode portion extending from the support portion;
  a movable electrode portion extending from the movable weight portion and disposed opposed to the fixed electrode portion; and
  first through third adjusting layers, wherein
  the first adjusting layer is provided at the movable weight portion, the second adjusting layer is provided at the fixed and movable electrode portions, and the third adjusting layer is provided at the elastically deformable connection portion.

2. The MEMS sensor according to claim 1, wherein the first through third adjusting layers include an insulated layer.

3. The MEMS sensor according to claim 1, wherein the first through third adjusting layers are formed on top or bottom of the movable weight portion, the fixed and movable electrode portions, and the elastically deformable connection portion, respectively.

4. The MEMS sensor according to claim 1, wherein the movable weight portion is a laminated layer structure including:
  a plurality of conductive layers, and
  inter-layer insulating layers which are disposed between the adjoining conductive layers of the plurality of conductive layers.

5. The MEMS sensor according to claim 4, wherein each of the inter-layer insulating layers is an embedded plug having a specific gravity larger than that of the inter-layer insulating layers.

6. The MEMS sensor according to claim 1, wherein a thickness of the first adjusting layer is different from the thickness of at least one of the second adjusting layer and the third adjusting layer.

7. The MEMS sensor according to claim 1, wherein
a layer-structure of the first adjusting layer is different from a layer-structure of at least one of the second adjusting layer and the third adjusting layer.

8. An electronic device comprising the MEMS sensor according to claim 1.

9. A MEMS sensor manufacturing method for a MEMS sensor including a support portion; a movable weight portion; an elastically deformable connection portion connecting the support portion and the movable weight portion; a fixed electrode portion extending from the support portion; and a movable electrode portion extending from the movable weight portion and disposed opposed to the fixed electrode portion, comprising:

forming a laminated layer structure on a substrate;

forming an adjusting layer at a top or bottom of the laminated layer structure;

forming a first cavity portion from the top of the laminated layer structure to a surface of the substrate, by anisotropic etching; and isotropically etching the substrate via the first cavity portion to form a second cavity portion between the substrate and the laminated layer structure.

* * * * *